(12) United States Patent
Park et al.

(10) Patent No.: US 11,270,995 B2
(45) Date of Patent: Mar. 8, 2022

(54) ISOLATION IN INTEGRATED CIRCUIT DEVICES

(71) Applicant: Intel Corporation, Santa Clara, CA (US)

(72) Inventors: Sang-Won Park, Portland, OR (US); Dennis G. Hanken, Beaverton, OR (US); Sishir Bhowmick, Hillsboro, OR (US); Leonard C. Pipes, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 149 days.

(21) Appl. No.: 16/483,641

(22) PCT Filed: Mar. 5, 2017

(86) PCT No.: PCT/US2017/020842
§ 371 (c)(1),
(2) Date: Aug. 5, 2019

(87) PCT Pub. No.: WO2018/164655
PCT Pub. Date: Sep. 13, 2018

(65) Prior Publication Data
US 2020/0126980 A1    Apr. 23, 2020

(51) Int. Cl.
*H01L 21/76* (2006.01)
*H01L 27/088* (2006.01)
*H01L 21/02* (2006.01)

(52) U.S. Cl.
CPC ...... *H01L 27/0886* (2013.01); *H01L 21/0228* (2013.01); *H01L 21/02222* (2013.01); *H01L 21/02274* (2013.01); *H01L 21/02337* (2013.01); *H01L 21/02345* (2013.01)

(58) Field of Classification Search
None
See application file for complete search history.

(56) References Cited

U.S. PATENT DOCUMENTS

| 7,579,241 | B2 * | 8/2009 | Hieda | H01L 27/115 257/E21.176 |
| 9,337,342 | B2 * | 5/2016 | Okazaki | H01L 21/0217 |
| 10,431,583 | B2 * | 10/2019 | Kim | H01L 29/66795 |
| 2009/0104789 | A1 | 4/2009 | Mallick et al. | |
| 2012/0142192 | A1 * | 6/2012 | Li | H01L 21/02274 438/700 |
| 2015/0137263 | A1 | 5/2015 | Lee et al. | |

(Continued)

FOREIGN PATENT DOCUMENTS

| WO | 2014209278 A1 | 12/2014 |
| WO | 2018164655 A1 | 9/2018 |

OTHER PUBLICATIONS

PCT International Search Report and Written Opinion issued in PCT/US2017/020842 dated Oct. 31, 2017; 13 pages.

*Primary Examiner* — Hung K Vu
(74) *Attorney, Agent, or Firm* — Patent Capital Group

(57) ABSTRACT

Disclosed herein are techniques for providing isolation in integrated circuit (IC) devices, as well as IC devices and computing systems that utilize such techniques. In some embodiments, a protective layer may be disposed on a structure in an IC device, prior to deposition of additional dielectric material, and the resulting assembly may be treated to form a dielectric layer around the structure.

13 Claims, 14 Drawing Sheets

(56) References Cited

U.S. PATENT DOCUMENTS

2015/0303281 A1* 10/2015 Fogel ............... H01L 21/28518
257/288
2015/0340274 A1* 11/2015 Ryan .................. H01L 21/762
438/424

* cited by examiner

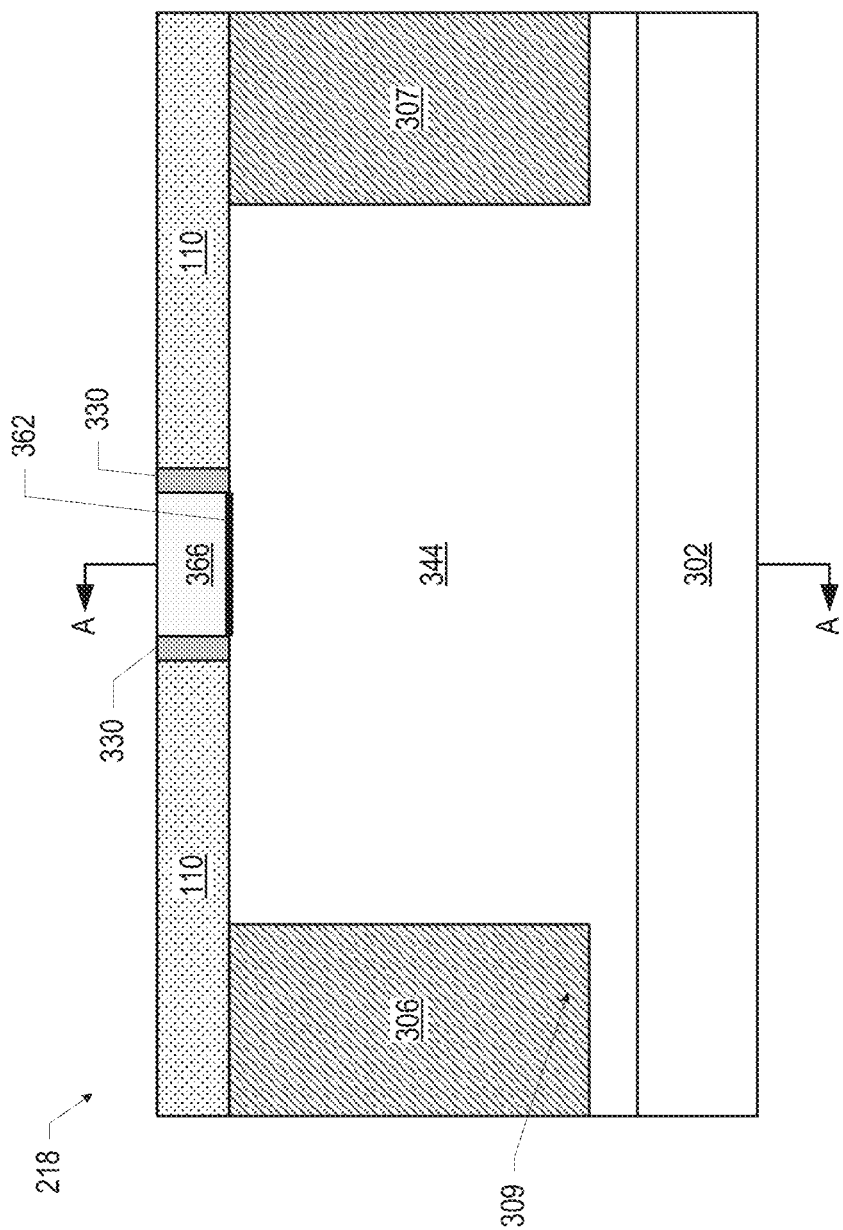

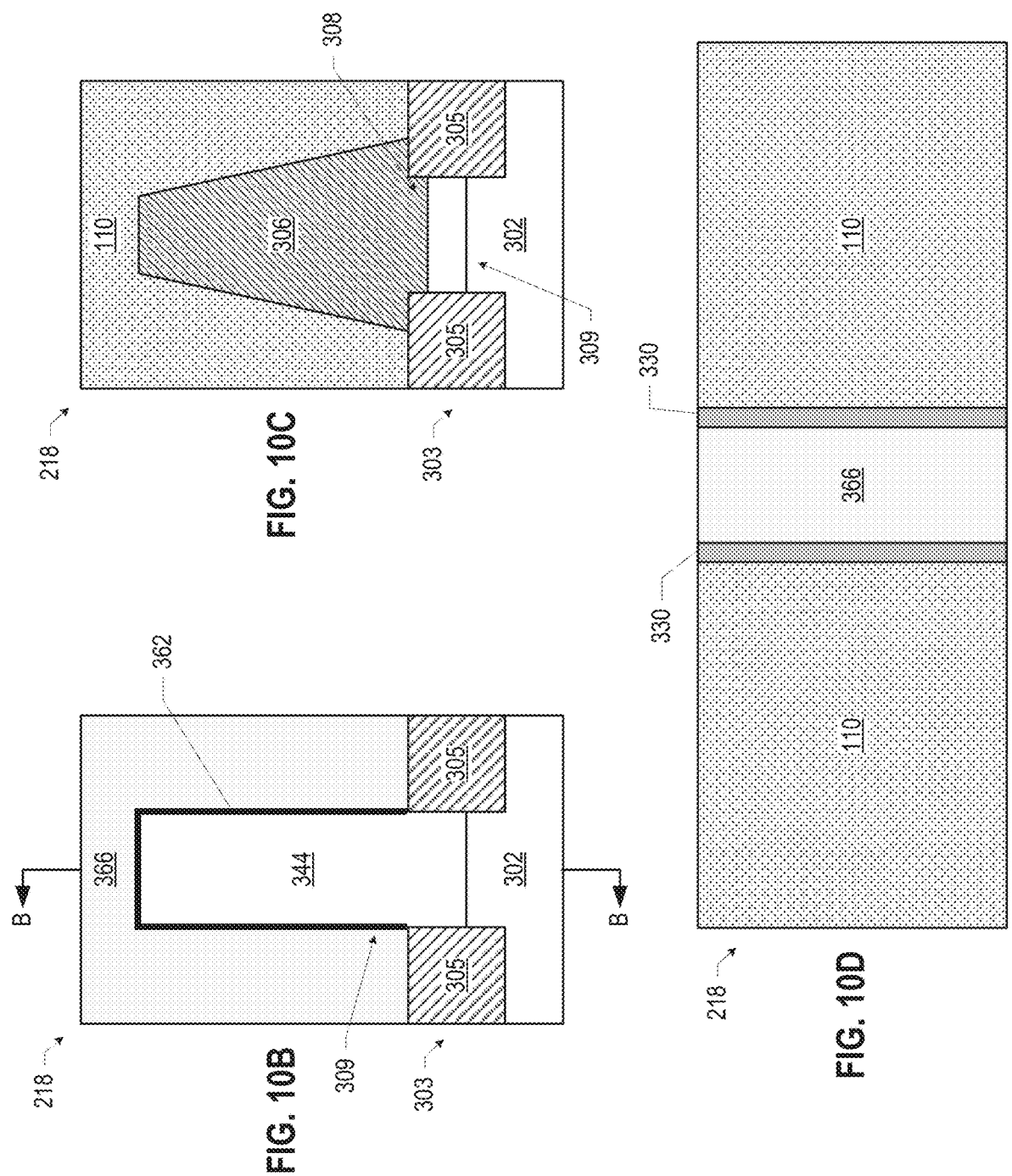

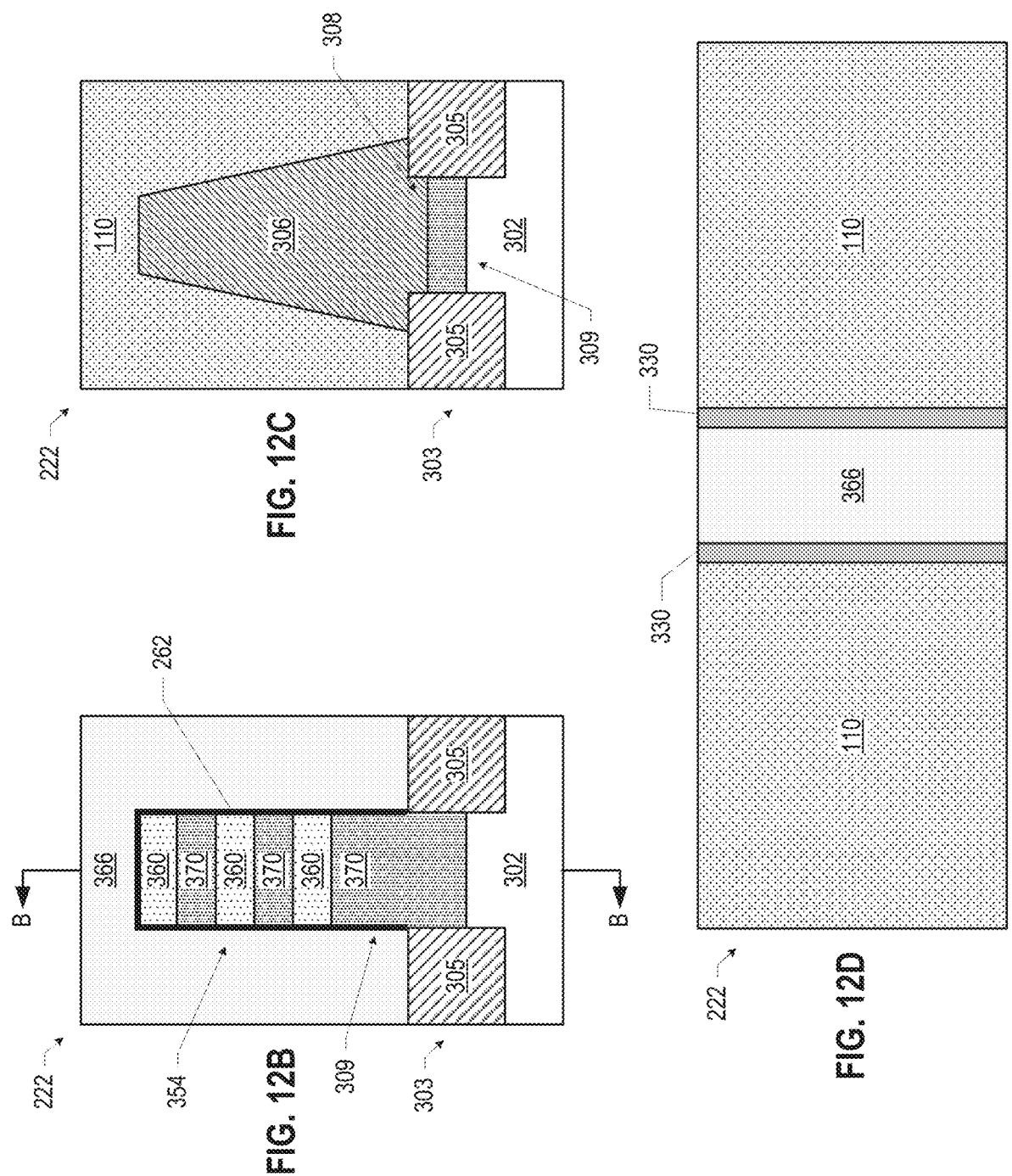

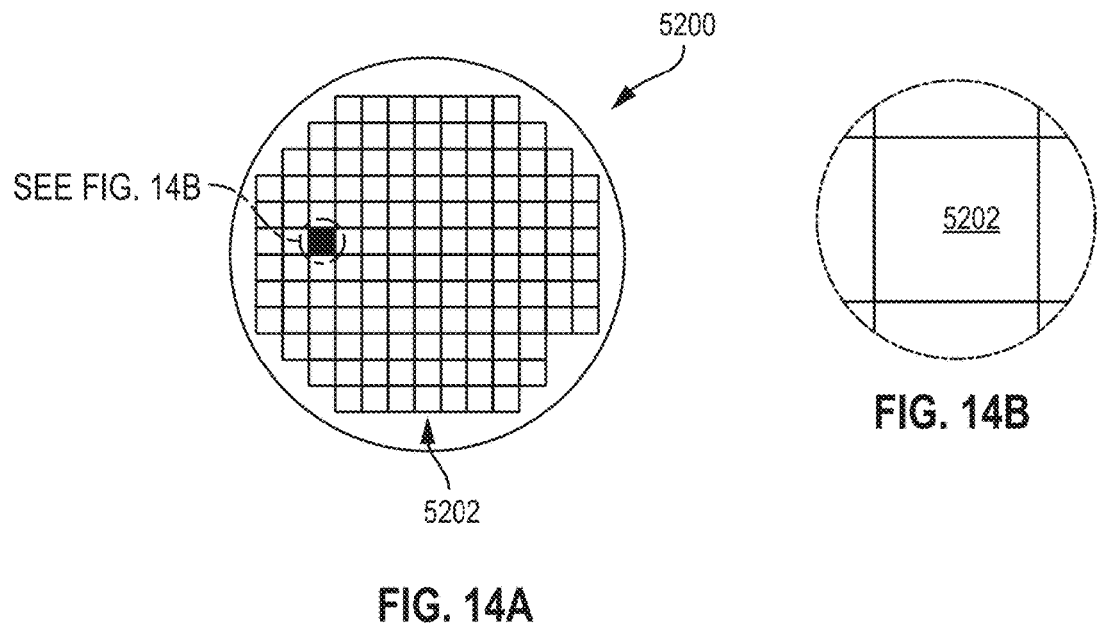
FIG. 14A
FIG. 14B
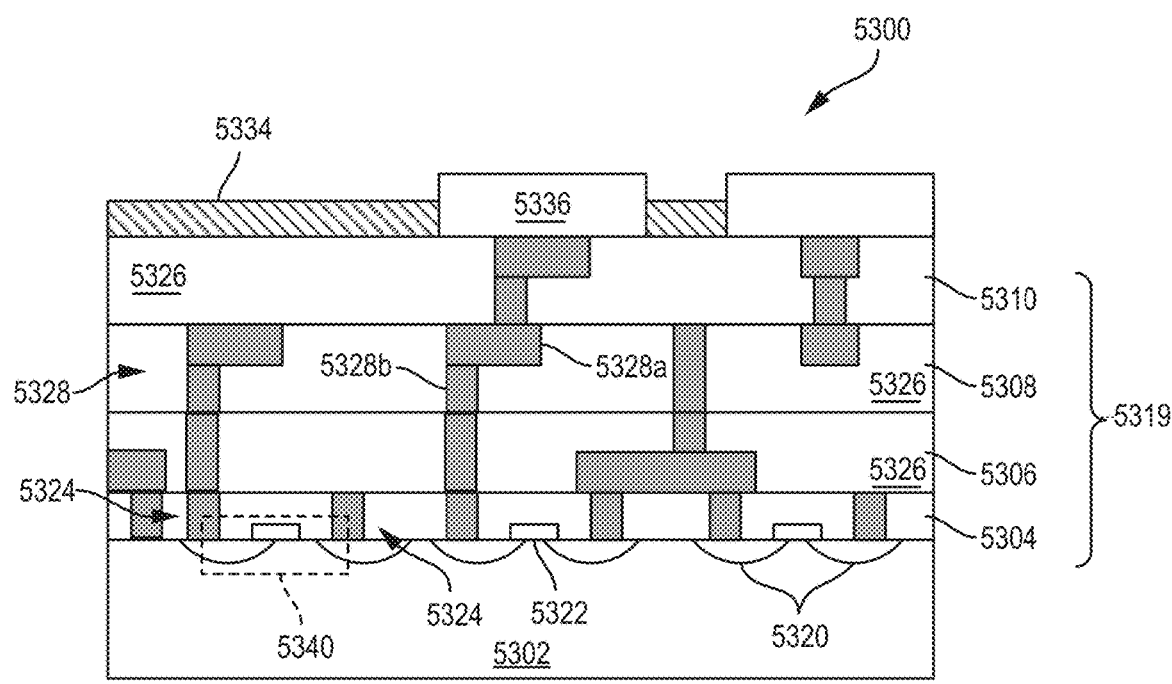
FIG. 15

ISOLATION IN INTEGRATED CIRCUIT DEVICES

CROSS-REFERENCE TO RELATED APPLICATION

This application is a national stage application under 35 U.S.C. § 371 of PCT International Application Serial No. PCT/US2017/020842, filed on Mar. 5, 2017 and entitled "ISOLATION IN INTEGRATED CIRCUIT DEVICES," which is hereby incorporated by reference in its entirety.

BACKGROUND

Integrated circuit (IC) devices typically include various structures (e.g., electrically conductive or semi-conductive structures) insulated from each other by a dielectric material. In some fabrication techniques, the structures are first formed, and the dielectric material is then deposited over and/or around the structures.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 9A-9D and 10A-10D are views of various stages in the formation and isolation of gates in a tri-gate transistor using the protective layer technique of FIGS. 1-4, in accordance with various embodiments.

FIGS. 11A-11D and 12A-12D are views of various stages in the formation and isolation of gates in an all-around gate transistor using the protective layer technique of FIGS. 1-4, in accordance with various embodiments.

FIGS. 14A and 14B are top views of a wafer and dies that may include dielectric layers formed using any of the protective layer techniques disclosed herein.

FIG. 15 is a cross-sectional side view of an IC device that may include dielectric layers formed using any of the protective layer techniques disclosed herein.

DETAILED DESCRIPTION

Figure 1:
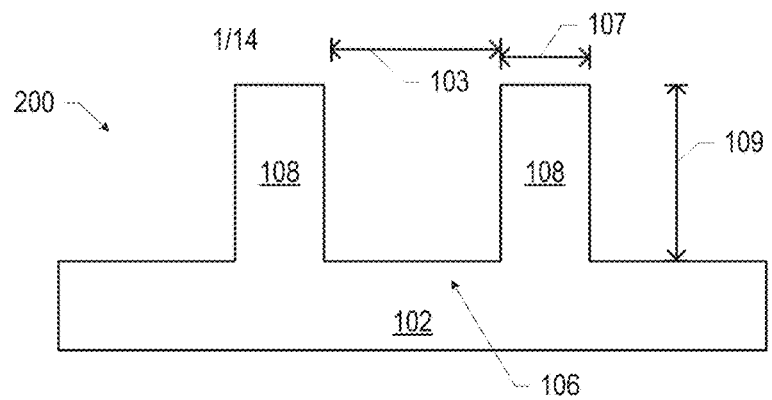
FIGS. 1-4 are cross-sectional views of various stages in the manufacture of an integrated circuit (IC) device using a protective layer technique, in accordance with various embodiments.

Disclosed herein are techniques for providing isolation in integrated circuit (IC) devices, as well as IC devices and computing systems that utilize such techniques. In some embodiments, a protective layer may be disposed on a structure in an IC device, prior to deposition of additional dielectric material, and the resulting assembly may be treated to form a dielectric layer around the structure.

In the following detailed description, reference is made to the accompanying drawings that form a part hereof, wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the disclosed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, a "high-k dielectric material" may refer to a material having a higher dielectric constant than silicon oxide.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments.

The accompanying drawings are not necessarily drawn to scale. While some figures generally indicate straight lines, right angles, and smooth surfaces, an actual implementation of the disclosed techniques may have less than perfect straight lines, right angles, etc., and some features may have surface topology or otherwise be non-smooth, given the real world limitations of fabrication processes. For ease of exposition, the term "FIG. 9" may be used to refer to the collection of FIGS. 9A-9D, the term "FIG. 10" may be used to refer to the collection of FIGS. 10A-10D, the term "FIG. 11" may be used to refer to the collection of FIGS. 11A-11D, the term "FIG. 12" may be used to refer to the collection of FIGS. 12A-12D, and the term "FIG. 14" may be used to refer to the collection of FIGS. 14A-14B.

As the dimensions of integrated circuit (IC) devices shrink, conventional dielectric deposition techniques may be unable to adequately fill the high aspect ratio trenches between close-together structures. For example, existing dielectric deposition processes such as sub-atmospheric CVD (SACVD), low-pressure CVD (LPCVD), plasma-enhanced CVD (PECVD), high-density plasma CVD (HDPCVD), and spin-on deposition (SOD) can have issues with seams/voids, surface sensitivity, adhesion issues, and shrinkage issues, all of which may affect performance. Newer techniques, such as flowable chemical vapor deposition (FCVD) may overcome some of these issues, but may cause degradation of the adjacent structures. When the adjacent structures are thin, this degradation may substantially compromise the integrity of the IC device, resulting in mechanical or electrical failure (e.g., by bending or collapsing). Thus, the design of IC devices must conventionally include features that are wide or large enough to withstand this damage, limiting the degree to which narrow or high aspect ratio features can be included in a manufacturable device.

Disclosed herein are protective layer techniques for dielectric deposition. These protective layer techniques may mitigate the degradation caused by aggressive dielectric deposition, and thus may improve the reliability and integrity of the resulting IC devices. The protective layer techniques disclosed herein may be used at any suitable stage(s) in IC fabrication. For example, the protective layer techniques disclosed herein may be useful whenever an underlying structure is susceptible to degradation due to the subsequent deposition of a dielectric material. The protective layer techniques disclosed herein may be particularly useful in such settings when the underlying structure includes narrow features that may be structurally or electrically compromised by this degradation. FIGS. 1-4 discuss various embodiments of the protective layer techniques with reference to general structures, and further figures illustrate some particular, non-limiting settings in which the protective layer techniques of FIGS. 1-4 may be usefully applied.

FIGS. 1-4 illustrate various stages in an integrated circuit (IC) device fabrication process flow, in accordance with various embodiments. FIG. 1 is a cross-sectional view of an assembly 200 including a base 102 and one or more structures 108 disposed thereon. The base 102 may include any underlying material or materials on which the structures 108 are disposed; for example, as discussed below, the base 102 may be a semiconductor substrate (e.g., a wafer), a silicon-on-insulator (SOI) structure, a fin structure, an interlayer dielectric stack including active and/or passive devices, etc. The structures 108 may include semiconductor material, dielectric material, conductive material, or any other suitable material arranged as desired. Although the structures 108 are illustrated as substantially rectangular in cross-section, this is simply for ease of illustration, and the structures 108 may have any suitable shape.

The structures 108 may have any suitable dimensions. In some embodiments, the structures 108 may be "narrow" in the sense that the structures 108 have a small width 107. In some embodiments, the width 107 of a structure 108 may be less than 5 nanometers (e.g., less than 4 nanometers, between 2 nanometers and 5 nanometers, between 3 nanometers and 5 nanometers, or between 3 nanometers and 4 nanometers). In some embodiments, the width 107 may be between 3 nanometers and 8 nanometers. In some embodiments, the structures 108 may have a height 109 between 100 nanometers and 200 nanometers (e.g., between 125 nanometers and 145 nanometers, between 145 nanometers and 165 nanometers, between 165 nanometers and 185 nanometers, or any other range).

The structures 108 may be spaced apart by recesses 106. In some embodiments, the structures 108 may be formed by patterning the recesses 106 into an initial base 102, while in other embodiments, the structures 108 may be fabricated by depositing additional materials onto the base 102. In some embodiments, adjacent structures 108 may be "close" together in that the recess 106 between them has a small width 103. In some embodiments, the width 103 may be less than or equal to 50 nanometers (e.g., less than or equal to 10 nanometers, less than or equal to 20 nanometers, less than or equal to 30 nanometers, or less than or equal to 40 nanometers). In some embodiments, a recess 106 may have a width 103 between 5 nanometers and 50 nanometers.

The height 109 of the structures 108 may also be considered to be the height 109 of the recesses 106. In some embodiments, a recess 106 may have a height-to-width aspect ratio (i.e., a ratio of the height 109 to the width 103, also referred to herein as an "aspect ratio") between 1:1 and 50:1 (e.g., between 10:1 and 40:1, between 10:1 and 20:1, between 5:1 and 10:1, between 10:1 and 15:1, equal to 25:1, equal to 30:1, equal to 35:1, equal to 40:1, or equal to 45:1). In some embodiments, the recess 106 may have a height-to-width aspect ratio greater than 3:1, greater than 4:1, greater than 7:1, greater than 8:1, or greater than 10:1.

Figure 2:
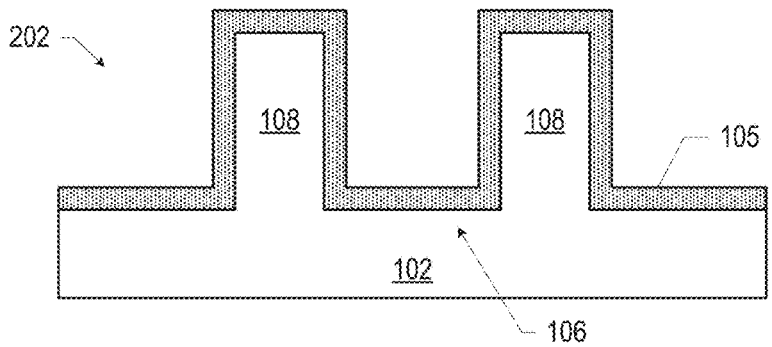

FIG. 2 illustrates an assembly 202 subsequent to providing a protective layer 105 on the assembly 200 (FIG. 1). The protective layer 105 may be a conformal layer, covering the sidewalls and top of the structures 108 and the bottoms of the recesses 106. In some embodiments, the protective layer 105 may be provided by atomic layer deposition (ALD) or LPCVD.

The protective layer 105 may have any suitable material composition, and the particular material composition may depend on the choice of initial dielectric material 111, as discussed below. In some embodiments, the protective layer 105 may include silicon, silicon oxide, silicon nitride, silicon carbide, silicon oxynitride, other oxides, other nitrides, other carbides, or any suitable combination of materials. The material composition of the protective layer 105 may be selected to achieve a desired level of "hermeticity" to the initial dielectric material 111; that is, the material composition of the protective layer 105 may serve as an adequate barrier to limit degradation of the structures 108 by the initial dielectric material 111.

In some embodiments, the protective layer 105 may be strained so as to exert a force on the underlying structures 108, and thereby alter the electrical properties of the underlying structures 108 (e.g., altering the conductivity, as known in the art). The amount of tensile or compressive strain in the protective layer 105 may be tuned by appropriately selecting the time, temperature, deposition conformality, and environmental conditions of deposition of the protective layer 105, as known in the art. The protective layer 105 may have any suitable thickness, which may depend on the deposition conditions of the protective layer 105 and its desired electrical properties. For example, in some embodiments, the thickness of the protective layer 105 may be between 1 nanometer and 4 nanometers.

Figure 3:
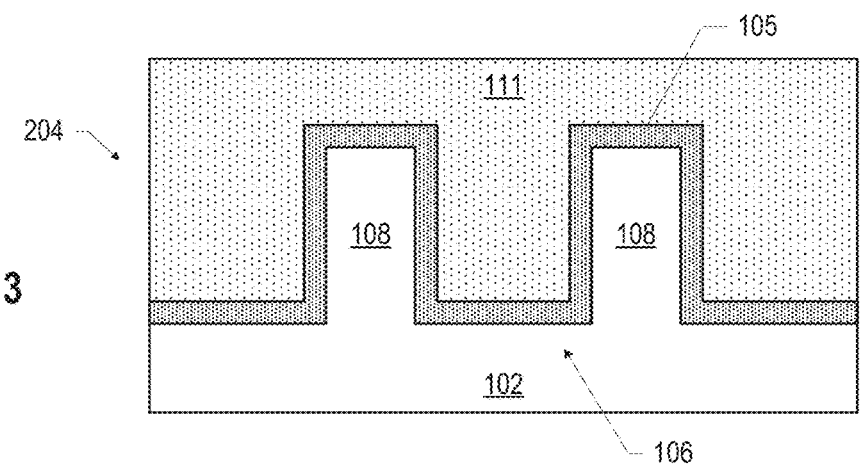

FIG. 3 illustrates an assembly 204 subsequent to providing an initial dielectric material 111 on the assembly 202 (FIG. 2). The initial dielectric material 111 may be spaced apart from the structures 108 by the intervening protective layer 105. The initial dielectric material 111 may be disposed within the one or more recesses 106 and may be disposed over the upper surfaces of the structures 108, as desired. In some cases, it may be desirable to provide a sufficient amount of the initial dielectric material 111 so as to provide a sufficient overburden of the initial dielectric material 111 over the structures 108 for subsequent processing (e.g., planarization and/or recessing, as discussed below with reference to FIGS. 7-8, 10, and 12). The various process conditions of the provision of the initial dielectric material 111 (e.g., pressure, temperature, chemical composition of ambient environment, etc.) may be customized as desired for particular target application or end-use.

Any suitable technique may be used to provide the initial dielectric material 111. In some embodiments, the initial dielectric material 111 may be deposited using a flowable chemical vapor deposition (FCVD) process, then cured and/or annealed. In some such embodiments, the selected FCVD process may utilize remote plasma-enhanced CVD (RPECVD). Using such a remote plasma process may help to maintain a low processing temperature, which in turn may help to maintain a desired fluidity/flowability of the initial dielectric material 111.

In some embodiments, the provision of the initial dielectric material 111 may begin with a flow of a silazane $(SiH_2NH)_n$-based polymer with a silicon-based precursor, such as trisilylamine $(N(SiH_3)_3)$. This example should not be taken as limiting, however; the individual precursor(s) and reactive gas(es) of the initial dielectric material 111, as well as their ratio, can be customized as desired for a given target application or end-use. In some embodiments, the initial dielectric material 111 may include any dielectric material that is (1) flowable (e.g., compatible with deposition using an FCVD process), and/or (2) suitable for deposition within recesses 106 of relatively high aspect ratio (e.g., having an aspect ratio in the range of about 3:1 to 40:1, in some cases).

In some embodiments, the curing of the initial dielectric material 111 may include providing an ambient environment of ozone ($O_3$), oxygen ($O_2$), and/or other initiation oxidant. In some embodiments, the curing of the initial dielectric material 111 may be performed under a flow of $O_3$ having a flow rate, for example, in the range of about $2.0 \times 10^4$-$5.4 \times 10^4$ standard cubic centimeters per minute (sccm). In some embodiments, the curing of the initial dielectric material 111 may be performed under a flow of $O_2$ having a flow rate, for example, in the range of about $2.5 \times 10^3$-$5.0 \times 10^3$ sccm. In some cases, curing of the initial dielectric material 111 may be performed at a temperature, for example, in the range of about 120-180 degrees C. (e.g., between 145 and 155 degrees C., or any other sub-range in the range of 120-180 degrees C.). In some cases, curing of the initial dielectric material 111 may be performed at a pressure, for example, in the range of about 500-700 Torr (e.g., between 550 and 650 Torr, or any other sub-range in the range of 500-700 Torr).

In some cases, curing the initial dielectric material 111 in an oxidant-rich environment may help to reduce silicon-nitrogen (Si—N) bonds and/or silicon-hydrogen (Si—H) bonds present after deposition of the initial dielectric material 111. That is, in some instances, the presence of silicon-hydrogen (Si—H) bonds may be decreased significantly (e.g., due to their relatively lower bond energy in an $O_3$-based curing treatment) and silicon-oxygen (Si—O) bond intensity may increase significantly and come to replace the silicon-nitrogen (Si—N) bonds initially present in the initial dielectric material 111. Thus, in some cases, the initial dielectric material 111 may become a stable oxide, such as silicon dioxide ($SiO_2$, or silica). In some other instances, the initial dielectric material 111 may become a stable nitride, such as silicon nitride ($Si_3N_4$). In some still other instances, the initial dielectric material 111 may become a stable carbide.

In some embodiments, the initial dielectric material 111 may undergo a wet chemical treatment process. In some cases, wet chemical treatment may be performed, for instance, using a wet bench process which utilizes hot de-ionized water (HDIW). In some other cases, wet chemical treatment may be performed, for instance, using a single wafer wet process which utilizes de-ionized water (DIW) at a temperature in the range of about 40-80 degrees C. (e.g., between 45 and 60 degrees C., or any other sub-range in the range of about 40-80 degrees C.). In some other embodiments, wet chemical treatment may be performed, for instance, using a single wafer wet process which utilizes a standard SC-1 chemistry utilizing at least one of ammonium hydroxide ($NH_4OH$), hydrogen peroxide ($H_2O_2$), hot de-ionized water (HDIW), and/or de-ionized water (DIW) at a temperature, for example, in the range of about 50-100 degrees C. (e.g., about 60-80 degrees C., or any other sub-range in the range of about 50-100 degrees C.). In some such cases, the flow rate of ammonium hydroxide ($NH_4OH$) may be in the range of about 30-200 milliliters per minute (mL/min) (e.g., in the range of 120-130 mL/min, or any other sub-range in the range of about 30-200 mL/min). The flow rate of hydrogen peroxide ($H_2O_2$) may be, in some cases, in the range of about 100-400 mL/min (e.g., in the range of 230-260 mL/min, or any other sub-range in the range of about 100-400 mL/min). The flow rate of hot de-ionized water (HDIW) may be, in some cases, in the range of about 1,500-1,800 ml/min (e.g., in the range of 1,600-1,650 ml/min, or any other sub-range in the range of about 1,500-1,800 mL/min). The flow rate of de-ionized water (DIW) may be, in some cases, in the range of about 300-400 mL/min (e.g., in the range of 350-375 mL/min, or any other sub-range in the range of about 300-400 mL/min). Other process conditions or techniques for in-situ curing of the initial dielectric material 111 may be used as suitable.

Figure 4:
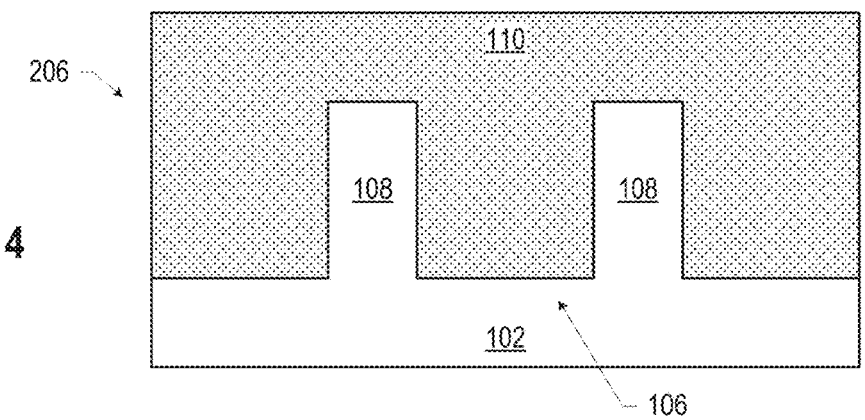

FIG. 4 illustrates an assembly 206 subsequent to performing a post-treatment on the assembly 204 (FIG. 3) to convert the protective layer 105 and the initial dielectric material 111 into a dielectric layer 110. In some embodiments, this conversion may occur when the post-treatment environment causes components of the initial dielectric material 111 to diffuse into the protective layer 105 and homogenize the material composition of the protective layer 105 and the initial dielectric material 111. For example, one or more oxidants included in the initial dielectric material 111 may diffuse into the protective layer 105 as a result of an oxidant-rich post-treatment environment (e.g., combined with a high temperature, such as a temperature between 300 and 800 degrees Celsius), converting the protective layer 105 and the initial dielectric material 110 into a relatively homogenous dielectric layer 110.

In some embodiments, the dielectric layer 110 may be an oxide-based dielectric layer, a nitride-based dielectric layer, and/or a carbide-based dielectric layer. The various process conditions of the post-treatment (e.g., pressure, temperature, chemical composition of ambient environment, intensity, power, bias, process time, etc.) may be customized as desired for a given target application or end-use. In some embodiments, post-treatments may, in addition to converting the protective layer 105 and the initial dielectric material 111 into a substantially homogeneous dielectric layer 110, (1) eliminate or otherwise reduce the presence of seams/voids within the dielectric layer 110; (2) eliminate or otherwise reduce the presence of impurities within the dielectric layer 110; (3) modify the dielectric properties of the dielectric layer 110; (4) modify the etch rate of the dielectric layer 110; and/or (5) increase the density of the dielectric layer 110.

In some embodiments, the cured initial dielectric material 111 and the protective layer 105 may undergo a thermal treatment process as part of forming the dielectric layer 110. Thermal treatment can be performed using any of a wide range of techniques, such as furnace annealing, rapid thermal annealing, flash annealing, ultraviolet (UV) light-based oxidation, electron beam annealing, and/or a combination of any one or more thereof. In some cases, a furnace-based, vertical directional solidification (VDS) process may be utilized, in which, within an environment of about 90% steam or greater (in some embodiments), the assembly 204 is subjected to a temperature between 400 and 800 degrees Celsius for a time between 1 and 10 hours. In some embodiments, the thermal treatment of the dielectric layer 110 may help, for example, to remove impurities, such as silicon-hydroxide (Si—OH) bonds and/or water ($H_2O$), which may be present in the dielectric layer 110. Other suitable techniques for thermal treatment of the assembly 204 will depend on a given application and will be apparent in light of this disclosure. In some embodiments, a thermal treatment may be combined with other treatment conditions, such as pressure and environmental chemistry, to achieve a desired result. For example, a diffusion treatment may include performing a thermal treatment at a suitable pressure and with suitable chemical species in the environment of the assembly 204.

In some embodiments, the cured initial dielectric material 111 and the protective layer 105 may undergo a plasma treatment process as part of forming the dielectric layer 110. Plasma treatment can be performed, for example, using a high-density and/or low-density plasma annealing process. In some cases, plasma treatment may be performed using an inert gas-based plasma, for example, with high power, low bias, and a temperature in the range of about 350-550 degrees C. (e.g., about 400-525 degrees C., or any other sub-range in the range of about 350-550 degrees C.). In some embodiments, the inert gas may include helium. However, the material composition, power, bias, and/or temperature utilized in the selected plasma treatment(s) can be customized as desired for a given target application or end-use.

As noted above, in some embodiments, the post-treatment may serve, at least in part, to modify the dielectric properties of the dielectric layer 110. For example, in some cases, the post-treatment may modify the dielectric layer 110 so as to bring its dielectric constant (K-value) into a desired range (e.g., in the range of 3.0-6.0, in the range of 4.5-5.0, or in the range of 5.0-5.5).

In some cases, the post-treatment may serve, at least in part, to densify the dielectric layer 110. In some instances, this may help to ensure that the resultant densified dielectric layer 110 can withstand subsequent processing (e.g., etching, planarization, etc.). However, as will be appreciated in light of this disclosure, it may be desirable to ensure that the density of the dielectric layer 110 is not made so excessive as to prevent or otherwise overly inhibit etching thereof. That is, in some instances, it may be desirable to ensure that dielectric layer 110 is sufficiently resistant, for example, to wet etching (e.g., by a hydrofluoric, or HF, acid-based wet etch chemistry), to provide for desired etching thereof. In a more general sense, the density of the dielectric layer 110 can be customized as desired for a given target application or end-use. Examples of further processing operations that may be performed on the dielectric layer 110 are discussed below (e.g., with reference to FIGS. 7, 8, 10, and 12)

As noted above, the protective layer techniques discussed herein may be applied at any of a number of different stages in the fabrication of an IC device. FIGS. 5-8, FIGS. 9-10, and FIGS. 11-12 illustrate a number of different settings in which the protective layer techniques disclosed herein may be used.

FIGS. 5-8 are cross-sectional views of various stages in the manufacture of an IC device including fins 113, in accordance with some embodiments. In particular, FIGS. 5-8 illustrate an embodiment in which the protective layer techniques disclosed herein are used to isolate different ones of the fins 113 from each other. Use of a protective layer technique in the isolation of the fins 113 may limit the erosion to the fins 113 that may be caused by aggressive deposition techniques (e.g., FCVD), while retaining the gap-filling performance of these deposition techniques.

Figure 5:
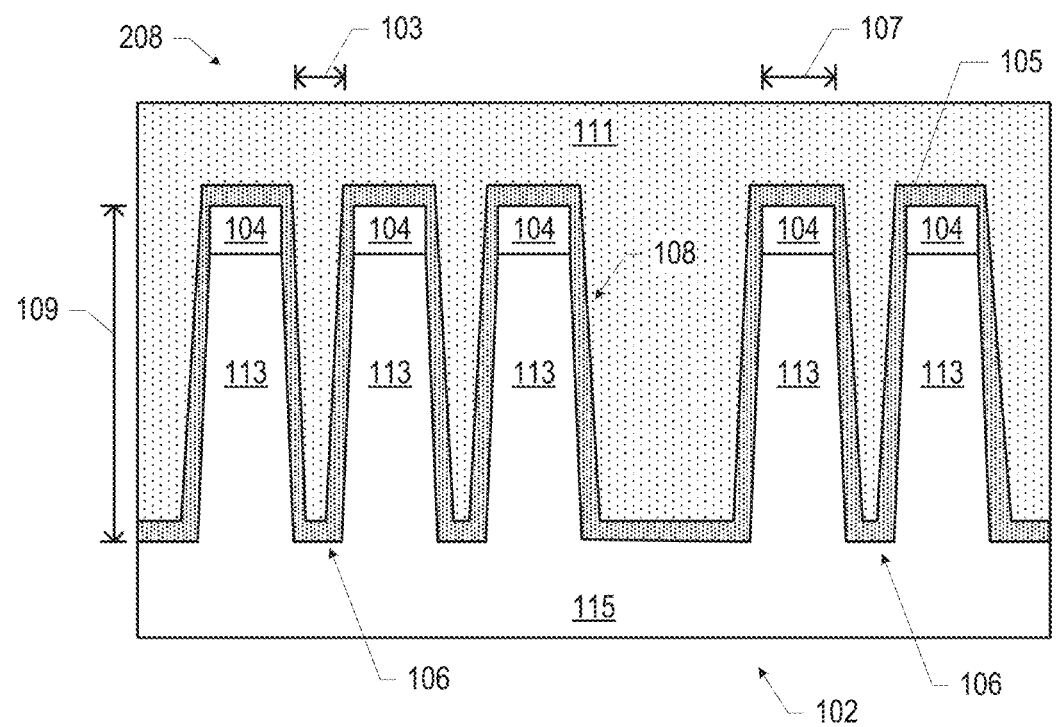
FIGS. 5-8 are cross-sectional views of various stages in the formation and isolation of semiconductor fins of an IC device using the protective layer technique of FIGS. 1-4, in accordance with various embodiments.

FIG. 5 illustrates an assembly 208 that is an embodiment of the assembly 204 of FIG. 3; in the assembly 208, the structures 108 are provided by fins 113 and portions of hardmask 104 disposed thereon, and the base 102 is provided by a semiconductor substrate 115. The recesses 106 may be disposed between adjacent fins 113, and may extend down to the semiconductor substrate 115. The protective layer 105 covers the structures 108, and an initial dielectric material 111 is disposed on the protective layer 105; the protective layer 105 and the initial dielectric material 111 may take the form of any of the embodiments disclosed herein. As known in the art, the fins 113 may be utilized, for example, in forming fin-based transistor devices (e.g., the tri-gate and all-around gate transistor devices discussed below with reference to FIGS. 9-10 and FIGS. 11-12), and/or other suitable fin-based semiconductor architectures.

The semiconductor substrate 115 may be formed from any suitable semiconductor material (or combination of such materials), such as silicon (Si), germanium (Ge), and/or silicon germanium (SiGe). In some embodiments, the semiconductor substrate 115 may be a bulk substrate, a silicon-on-insulator (SOI) structure, a wafer, and/or a multi-layered structure.

The hardmask 104 may include any suitable hardmask material (or combination of such materials). For example, in some embodiments, the hardmask 104 may include a nitride, such as silicon nitride ($Si_3N_4$) or titanium nitride (TiN); an oxide, such as silicon dioxide ($SiO_2$); silicon carbon nitride (SiCN); silicon oxynitride ($SiO_xN_y$); and/or a combination of any one or more thereof.

The hardmask 104 can be formed using any suitable technique (or combination of techniques). For example, the hardmask 104 may be formed using a chemical vapor deposition (CVD) process, a physical vapor deposition (PVD) (e.g., sputtering), electron beam evaporation, and/or a combination of any one or more thereof. The dimensions (e.g., thickness) of the hardmask 104 can be customized as desired for a given target application or end-use. In some embodiments, the hardmask 104 may have a substantially uniform thickness, while in other embodiments, the hardmask 104 may have a non-uniform or otherwise varying thickness The hardmask 104 may be patterned using any suitable lithography technique (or combination of such techniques). As known in the art, the pattern of the hardmask 104 may be used to define the pattern of the fins 113, and thus the dimensions (e.g., width) of the openings patterned into the hardmask 104 may contribute to determining the widths 103 and 107 of the recesses 106 and fins 113, respectively. Note that, in the embodiment of FIGS. 5-8, the width 103 is the width of the recess 106 at the "bottom" of the recess 106, and the width 107 is the width of a fin 113 at the "top" of the fin 113. In some embodiments, the hardmask 104 may be omitted from the assembly 208.

In some embodiments, the fins 113 may be formed by etching the recesses 106 into an initial semiconductor substrate 115, in accordance with the pattern of the hardmask 104. The initial semiconductor substrate 115 may be patterned using any suitable lithography technique (or combination of such techniques), such as wet etch and/or dry etch processes followed by polishing, cleans, etc., as known in the art. In some embodiments, the assembly 208 may be the product of highly directional (e.g., anisotropic) dry etching in accordance with the pattern of the hardmask 104, etching into the initial semiconductor substrate 114 and forming the fins 113 and the one or more recesses 106.

The fins 113 and recesses 106 of the assembly 208 may have any suitable dimensions. In some embodiments, the width 107 of the fins 113 may be less than 5 nanometers (e.g., less than 4 nanometers, between 2 nanometers and 5 nanometers, between 3 nanometers and 5 nanometers, or between 3 nanometers and 4 nanometers). In some embodiments, the width 107 of the fins 113 may be between 3 nanometers and 8 nanometers. In some embodiments, the fins 113 may have a height 109 between 100 nanometers and 200 nanometers (e.g., between 125 nanometers and 145 nanometers, between 145 nanometers and 165 nanometers, between 165 nanometers and 185 nanometers, or any other range). In some embodiments, the width 103 of the recesses 106 may be less than or equal to 70 nanometers (e.g., less than or equal to 10 nanometers, less than or equal to 20 nanometers, less than or equal to 30 nanometers, or less than or equal to 40 nanometers). In some embodiments, a recess 106 may have a width 103 between 5 nanometers and 50 nanometers. In some embodiments, a recess 106 may have an aspect ratio (i.e., a ratio of the height 109 to the width 103) between 1:1 and 50:1 (e.g., between 10:1 and 40:1, between 10:1 and 20:1, between 5:1 and 10:1, between 10:1 and 15:1, equal to 25:1, equal to 30:1, equal to 35:1, equal to 40:1, or equal to 45:1). In some embodiments, the recess 106 may have a height-to-width aspect ratio greater than 3:1, greater than 4:1, greater than 7:1, greater than 8:1, or greater than 10:1.

Figure 6:
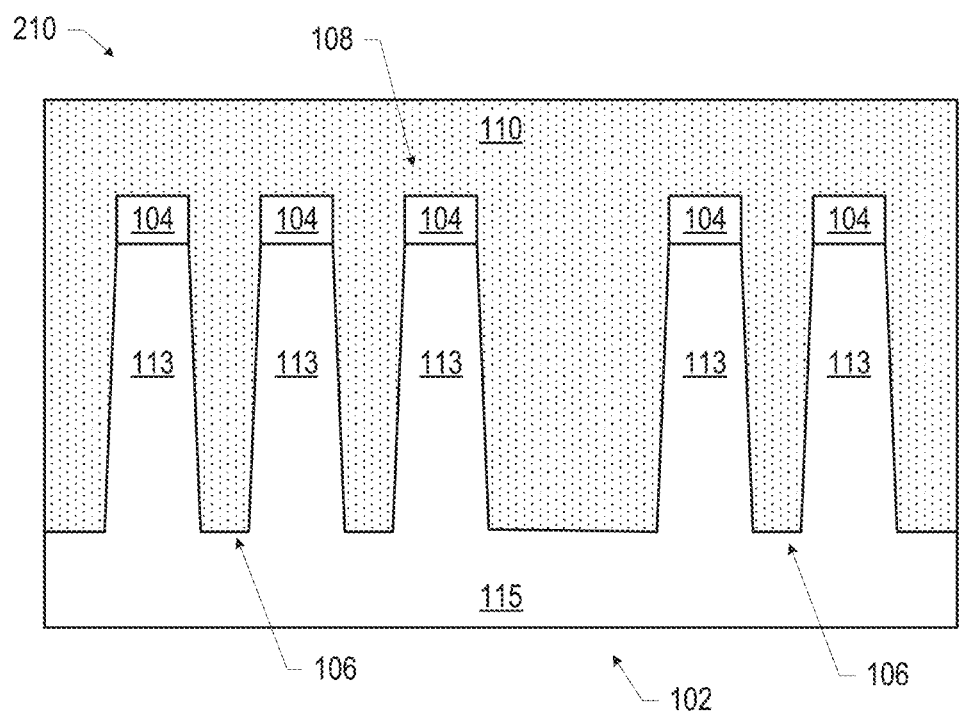

FIG. 6 illustrates an assembly 210 subsequent to processing the protective layer 105 and the initial dielectric material 111 to form a dielectric layer 110 over the fins 113 and the hardmask 104 of the assembly 208 (FIG. 5), in accordance with any of the techniques discussed herein (e.g., with reference to FIGS. 3 and 4). The assembly 210 of FIG. 6 is thus an embodiment of the assembly 206 of FIG. 4. As illustrated in FIG. 6, the dielectric layer 110 may extend over the fins 113 and the hardmask 104, and thus may be said to overburden the assembly 208. The dielectric layer 110 may fill or substantially fill the recesses 106.

Figure 7:
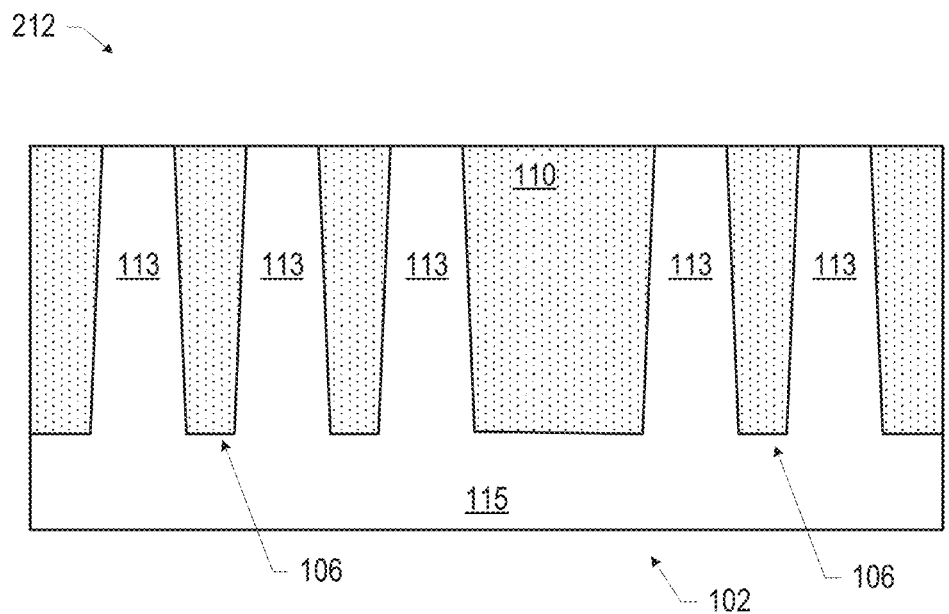

FIG. 7 illustrates an assembly 212 subsequent to planarizing the assembly 210 (FIG. 6) to remove material at the "top" surface of the assembly 210. The planarization may remove (1) excess portions of the dielectric layer 110; (2) the hardmask 104; and/or (3) excess portions of the one or more fins 113. In some embodiments, the planarization may include a chemical-mechanical planarization (CMP) process, an etch-and-clean process, and/or any other suitable planarization/polish process, as appropriate.

Figure 8:
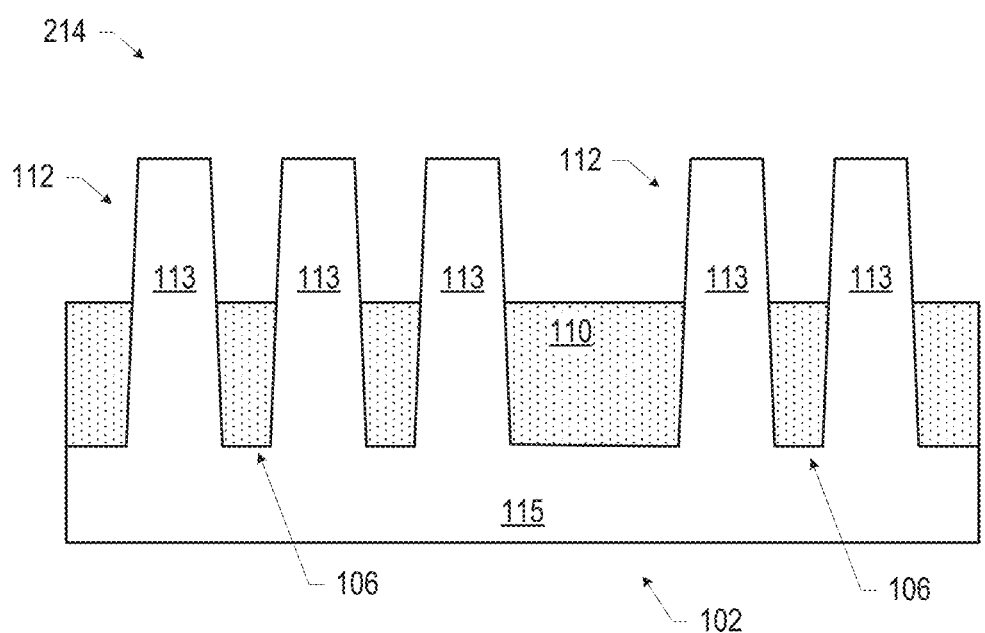

FIG. 8 illustrates an assembly 214 subsequent to recessing the dielectric layer 110 of the assembly 212 (FIG. 7). The dielectric layer 110 may be recessed using any suitable technique (or combination of techniques). For example, in some embodiments, the dielectric layer 110 may be recessed using a chemical (e.g., remote plasma-based) dry etch process, or a hydrofluoric acid (HF) acid-based wet etch chemistry. Recessing the dielectric layer 110 may reduce its thickness, thereby exposing one or more portions 112 of the one or more fins 113. The exposed portion 112 of a given fin 113 may be available for downstream use or further processing. For example, a given portion 112 may provide a structure upon which an additional layer and/or components can be populated; for example, the portion 112 may provide the fin 344 discussed below with reference to FIGS. 9-10, or the fin 354 discussed below with reference to FIGS. 11-12. Thus, recessing the dielectric layer 110 may help to define the active fin area of active fin devices formed from the assembly 214, and the dielectric layer 110 may provide isolation between active fin devices, in accordance with some embodiments.

FIGS. 9-10 are various views of example stages in the manufacture of an IC device including a tri-gate transistor, in accordance with various embodiments. In particular, FIGS. 9-10 illustrate an embodiment in which the protective layer techniques disclosed herein are used to provide a dielectric layer 110 around spacers 330 that abut the gate of a tri-gate transistor. Aggressive dielectric deposition techniques may damage the spacers 330; use of the protective layer techniques disclosed herein may preserve the spacers 330 during deposition of the dielectric layer 110.

Figure 9A:
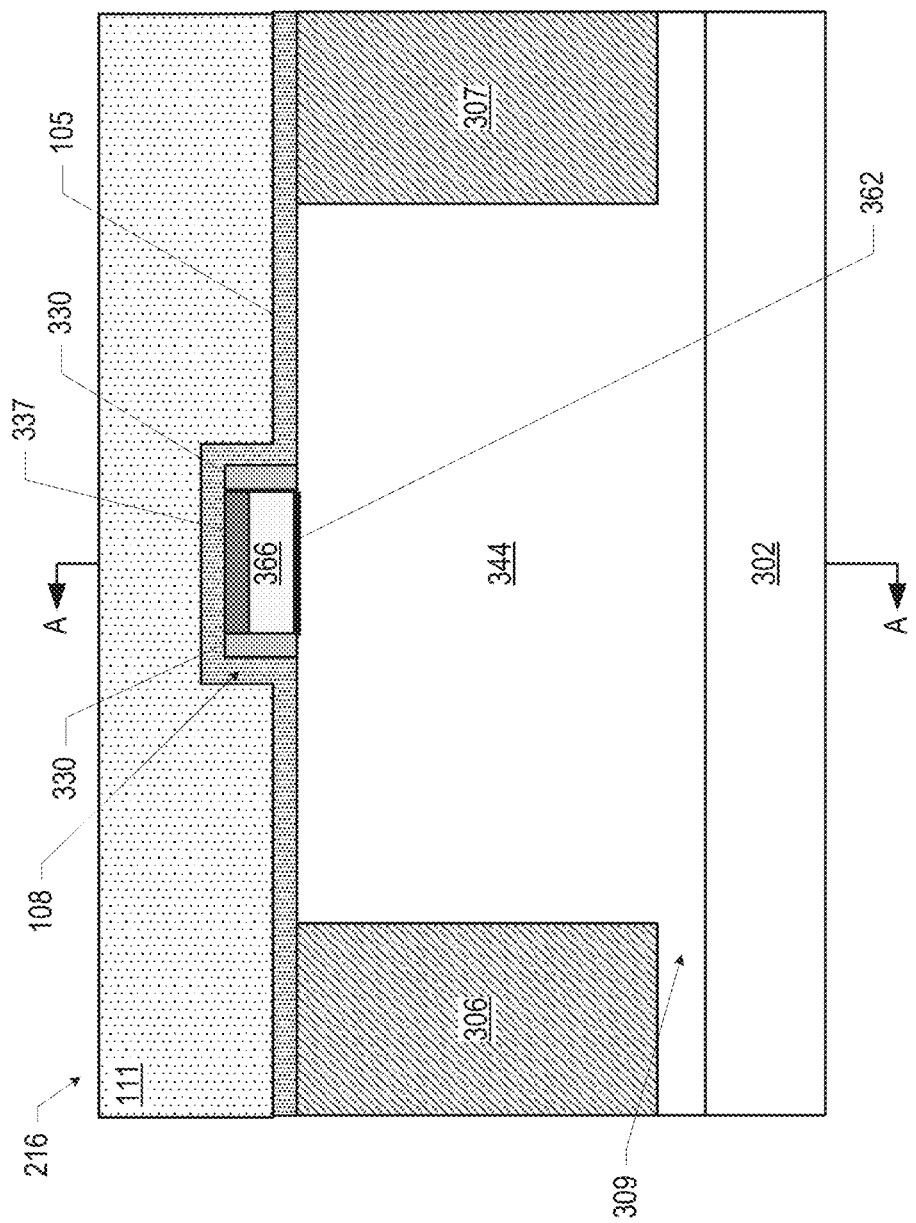
Figure 9B:
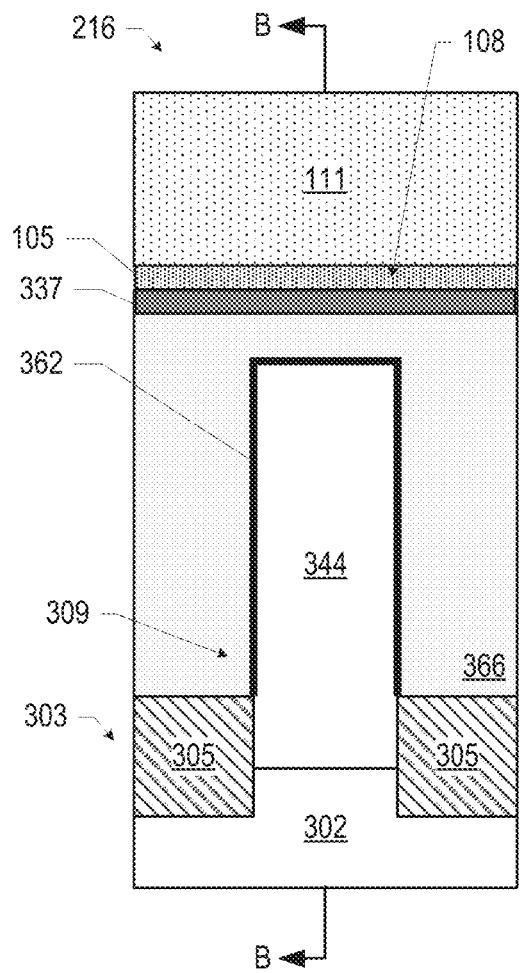
Figure 9C:
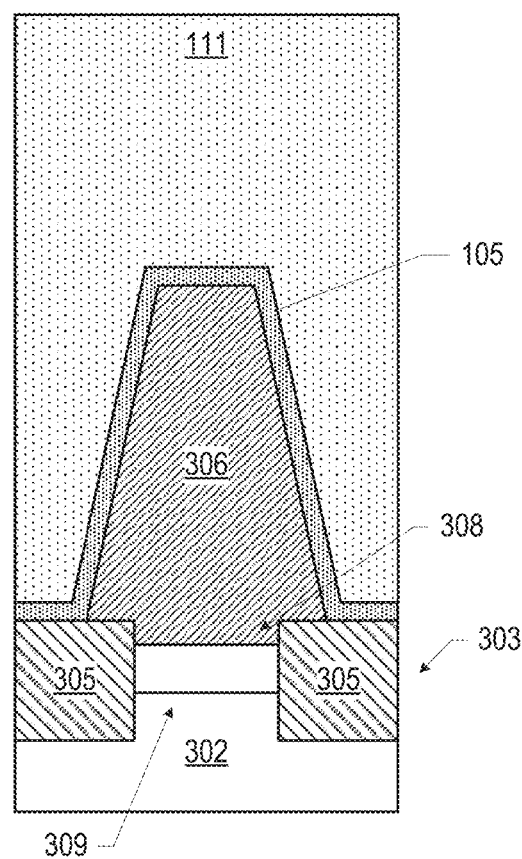
Figure 9D:
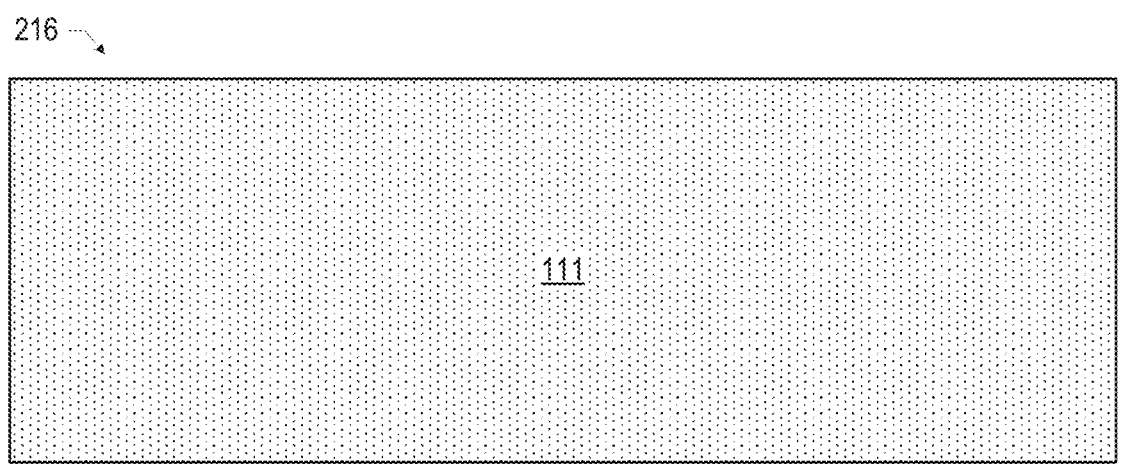

FIG. 9A is a side cross-sectional view of an assembly 216 along the fin 344, FIG. 9B is a cross-sectional view taken through the section A-A of FIG. 9A, FIG. 9C is a side view taken toward the carrier reservoir 306, and FIG. 9D is a top view. The assembly 216 is an embodiment of the assembly 204 of FIG. 3; in the assembly 216, the structures 108 are provided by gate material 366, a hardmask 337, and spacers 330 disposed at opposite faces of the gate material 366/hardmask 337. The base 102 is provided by a fin 344 on and around which the gate material 366 and the spacers 330 are disposed. The protective layer 105 covers the structure 108, and an initial dielectric material 111 is disposed on the protective layer 105; the protective layer 105 and the initial dielectric material 111 may take the form of any of the embodiments disclosed herein.

The assembly 216 may include a substrate 302 on which carrier reservoirs 306 and 307 are disposed. The carrier reservoirs 306 may provide the source and drain for a tri-gate transistor formed from the assembly 216. In some embodiments, the carrier reservoirs 306 and 307 may be embedded epi carrier reservoirs, and may be formed by epitaxy after the formation of the fin 344. For example, the carrier reservoirs 306 and 307 may include an epitaxially grown single crystalline semiconductor such as, but not limited to, Si, Ge, GeSn, SiGe, GaAs, InSb, GaP, GaSb, InAlAs, InGaAs, GaSbP, GaAsSb, GaN, GaP, or InP. In other embodiments, the carrier reservoirs 306 and 307 may be doped extensions of the fin 344. The carrier reservoirs 306 and 307 may have an n-type conductivity or a p-type conductivity. In some embodiments, the carrier reservoirs 306 and 307 have a doping concentration between $3 \times 10^{18}$ atoms/cm$^3$ to $3 \times 10^{21}$ atoms/cm$^3$. The carrier reservoirs 306 and 307 may have a uniform doping concentration or may include sub-regions of different concentrations or dopant profiles. In some embodiments, the carrier reservoirs 306 and 307 may have the same doping concentration profile; in other embodiments, the doping concentration profiles of the carrier reservoirs 306 and 307 may differ from each other. In some embodiments, the top surface of the substrate 302 may be recessed beneath the top surface of an adjacent shallow trench isolation (STI) layer 305, forming a trench 308 in which the carrier reservoirs 306 and 307 are disposed. In some embodiments, the carrier reservoirs 306 and 307, and/or the fin 344, may be strained.

The gate dielectric 362 may be disposed between the gate material 366 and the fin 344. The gate material 366 and the gate dielectric 362 may be sacrificial materials (i.e., materials that will be removed and replaced with alternate materials to form the gate electrode and gate dielectric, respectively, in the IC device) or may themselves be the "final" materials for a gate in the IC device.

A hardmask 337 may be disposed on the gate material 366, and spacers 330 may be disposed on opposite faces of the gate material 366/hardmask 337.

In some embodiments, the substrate 302 may include one or more epitaxial single crystalline semiconductor layers (e.g., silicon, germanium, silicon germanium, gallium arsenide, indium phosphide, indium gallium arsenide, aluminum gallium arsenide, etc.) grown atop a distinct crystalline substrate (silicon, germanium, gallium arsenide, sapphire, etc.). In one such embodiment, the epitaxially grown semiconductor layers may provide one or more buffer layers 309 having lattice constants different from the distinct crystalline substrate. The buffer layers 309 may serve to grade the lattice constant from the distinct crystalline substrate to the top surface. For example, the substrate 302 may include epitaxially grown silicon germanium (SiGe) buffer layers 309 on a distinct crystalline silicon substrate. The germanium concentration of the SiGe buffer layers 309 may increase their germanium content from the bottom-most buffer layer to the top-most buffer layer (e.g., from 30% germanium to 70% germanium), thereby gradually increasing the lattice constant of the substrate 302. In some embodiments, the buffer layers 309 may have a thickness between 500 nanometers and 3.5 microns.

STI regions 303 may be disposed on the substrate 302. STI regions 303 may serve to reduce current leakage between devices formed adjacent to one another. As noted above, an STI layer 305 may be disposed in the STI regions 303. The STI layer 305 may include any appropriate dielectric material, such as silicon oxide, silicon nitride, silicon oxynitride, a low-k dielectric, and any combination thereof. In some embodiments, the STI layer 305 may itself be a dielectric layer 110, formed in accordance with any of the protective layer techniques disclosed herein (e.g., as discussed above with reference to FIGS. 5-8); in such embodiments, the fin 344 may act as a structure 108.

The fin 344 may be formed from a material that can be reversely altered from an insulating state to a conductive state by applying external electric fields. For example, the fin 344 may be formed of Si, Ge, SiGe, GaAs, InSb, GaP, GaSb, InAlAs, InGaAs, GaSbP, GaAsSb, and/or InP. In some particular embodiments, the fin 344 may include an undoped lattice-stressed single crystalline semiconductor material having a carrier mobility greater than single crystalline silicon. The absence of dopants in the fin 344 may reduce scattering of charge carriers and may help to improve carrier mobility and thus increase drive current. Lattice stress in the fin 344 may also enhance carrier mobility and improve device performance. In some embodiments, the fin 344 may be compressively stressed for enhanced hole mobility in p-type tri-gate transistors, and may be tensilely stressed for enhanced electron mobility in n-type tri-gate transistors.

The gate dielectric 362 may include any suitable gate dielectric, such as, but not limited to, SiO2, SiON, and SiN. In some embodiments, the gate dielectric 362 may include a high-k gate dielectric layer, such as a metal oxide dielectric (e.g., Ta2O5, TiO2, HfO2, HfSiOx, ZrO2, etc.). The gate dielectric 362 may also include other types of high-k dielectric layers, such as, but not limited to, lead zirconate titanate (PZT) or barium strontium titanate (BST). The gate dielectric 362 may include any combination of the above dielectric materials; in some embodiments, the gate dielectric 362 may include multiple different layers of dielectric materials. In some embodiments, the gate dielectric 362 may have a thickness between 30 angstroms and 60 angstroms. In a specific embodiment, the gate dielectric 362 includes HfO$_2$ and has a thickness between 3 nanometer and 6 nanometers.

The gate material 366 may include any suitable gate electrode material. In some embodiments, the gate material 366 may include a metal such as, but not limited to, Ti, TiN, TaN, W, Ru, TiAl, or any combination thereof. In some embodiments, the gate material 366 may be formed from a material having a work function between 3.9 eV and 4.2 eV. In some embodiments, the gate material 366 may have a work function between 4.8 eV and 5.2 eV. In some embodiments in which the fin 344 is undoped or very lightly doped, the gate material 366 may have a mid-gap work function between 4.3 eV and 4.7 eV.

The assembly 216 may be formed by forming the fin 344 on the substrate 302 (e.g., by etching the fin 344 from an initial substrate 302), providing the STI layer 305 (e.g., by blanket deposition, planarization, then recess), providing the gate dielectric 362 and the gate material 366, providing and patterning the hardmask 337, patterning the gate dielectric 362 and the gate material 366 in accordance with the template provided by the patterned hardmask 337, forming the spacers 330 on the side faces of the patterned gate material 366 and hardmask 337, and then forming the carrier reservoirs 306 and 307.

The pair of sidewall spacers 130 may be formed using conventional methods of forming selective spacers, as known in the art. In some embodiments, a conformal dielectric spacer layer, such as, but not limited to, silicon oxide, silicon nitride, silicon oxynitride, and combinations thereof, is first blanket-deposited on all structures, including the fin 344. The dielectric spacer layer may be deposited in a conformal manner so that it has substantially equal thicknesses on both vertical surfaces and horizontal surfaces. The dielectric spacer layer may be deposited using conventional CVD methods such as low-pressure chemical vapor deposition (LPCVD) and plasma-enhanced chemical vapor deposition (PECVD), for example. In some embodiments, the dielectric spacer layer may be deposited to a thickness between 2 nanometers and 10 nanometers. Next, an unpatterned anisotropic etch may be performed on the dielectric spacer layer using conventional anisotropic etch methods, such as reactive ion etching (RIE). During the anisotropic etching process, most of the dielectric spacer layer may be removed from horizontal surfaces, leaving the dielectric spacer layer on the vertical surfaces, as shown. Next, an unpatterned isotropic etch may be performed to remove the remaining dielectric spacer layer from any horizontal surfaces, leaving pairs of spacers 330. In some embodiments, the isotropic etch is a wet etch process. In a specific embodiment, where the dielectric spacer layer is silicon nitride or silicon oxide, the isotropic etch may employ a wet etchant solution comprising phosphoric acid ($H_3PO_4$) or a buffered oxide etch (BOE), respectively. In an alternate embodiment, the isotropic etch may be a dry etch process. In one such embodiment, nitrogen trifluoride ($NF_3$) gas may be employed in a downstream plasma reactor to isotropically etch the dielectric spacer layers. Although the spacers 330 are illustrated as having substantially rectangular cross-sections, this is for ease of illustration; in some embodiments, the spacers 330 may be thinner farther from the substrate 302 and thicker closer to the substrate 302. In some embodiments, the spacers 330 may have a convex shape, curving outward away from the associated gate material 366.

FIG. 10 illustrates an assembly 218 subsequent to processing the protective layer 105 and the initial dielectric material 111 to form a dielectric layer 110 over the spacers 330/hardmask 337/gate material 366 of the assembly 216

(FIG. 9), in accordance with any of the techniques discussed herein (e.g., with reference to FIGS. 3 and 4), and then polishing back the excess dielectric layer 110 and hardmask 337. The assembly 218 of FIG. 10 is thus an embodiment of the assembly 206 of FIG. 4. In FIG. 10, the "A" sub-figure represents a cross-sectional view analogous to that of FIG. 9A, the "B" sub-figure represents a cross-sectional view analogous to that of FIG. 9B, the "C" sub-figure represents a cross-sectional view analogous to that of FIG. 9C, and the "D" sub-figure represents a top view analogous to that of FIG. 9D. The polishing of the excess dielectric layer 110 and removal of the hardmask 337 may be achieved by using CMP or any other suitable technique (e.g., as discussed above with reference to FIG. 7).

The assembly 218 may be further processed to form a tri-gate transistor by, for example, replacing the gate electrode material 366/gate dielectric 362 with other gate electrode material/gate dielectric when the gate material 366/gate dielectric 362 are sacrificial (e.g., in a replacement metal gate (RMG) process), and forming interconnects to the gate, source, and drain, among other steps.

FIGS. 11-12 are various views of example stages in the manufacture of an IC device including an all-around gate transistor, in accordance with various embodiments. In particular, FIGS. 11-12 illustrate an embodiment in which the protective layer techniques disclosed herein are used to provide a dielectric layer 110 around spacers 330 that abut the gates of an all-around gate transistor. As noted above, aggressive dielectric deposition techniques may damage the spacers 330; use of the protective layer techniques disclosed herein may preserve the spacers 330 during deposition of the dielectric layer 110.

Figure 11A:
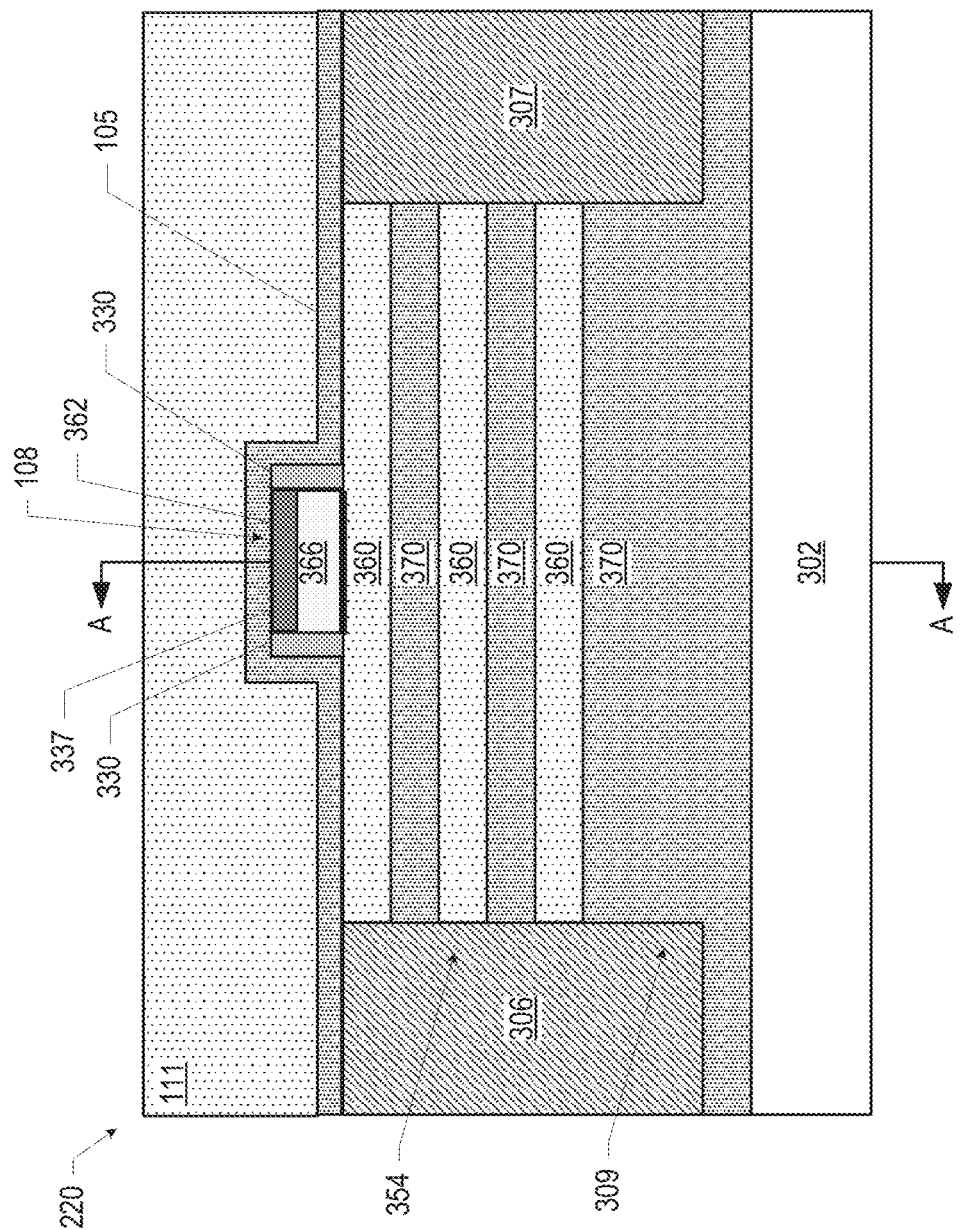
Figures 11B, 11C:
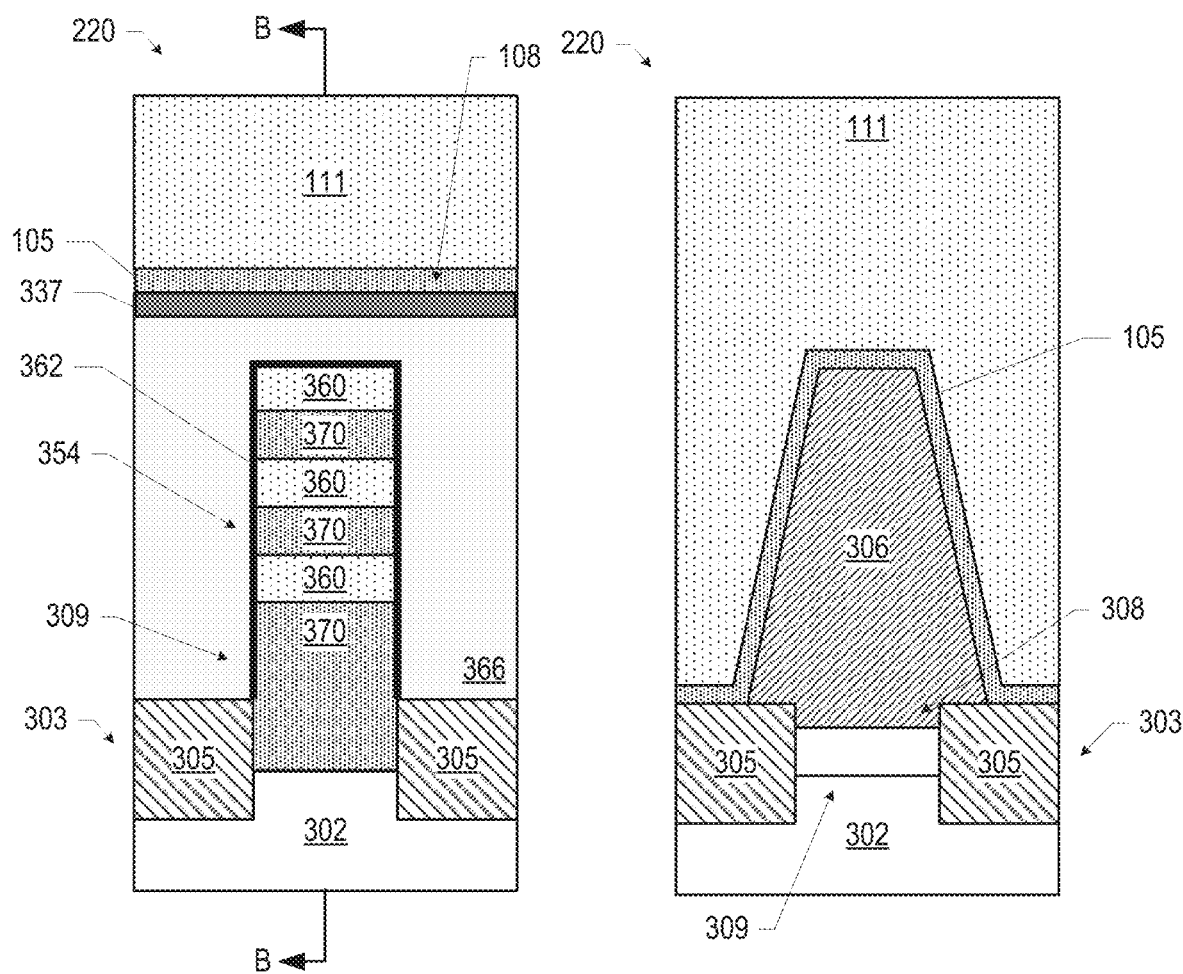
Figure 11D:
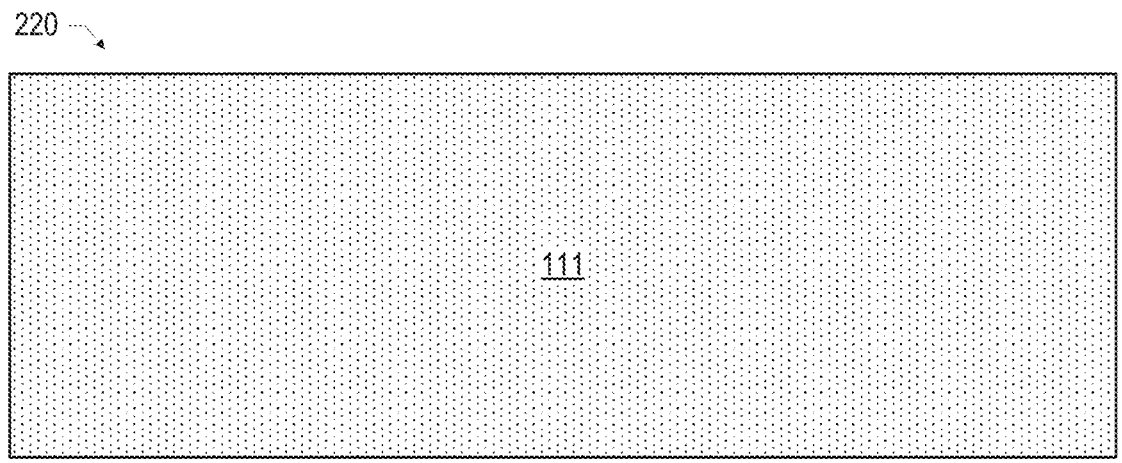
Figure 12A:
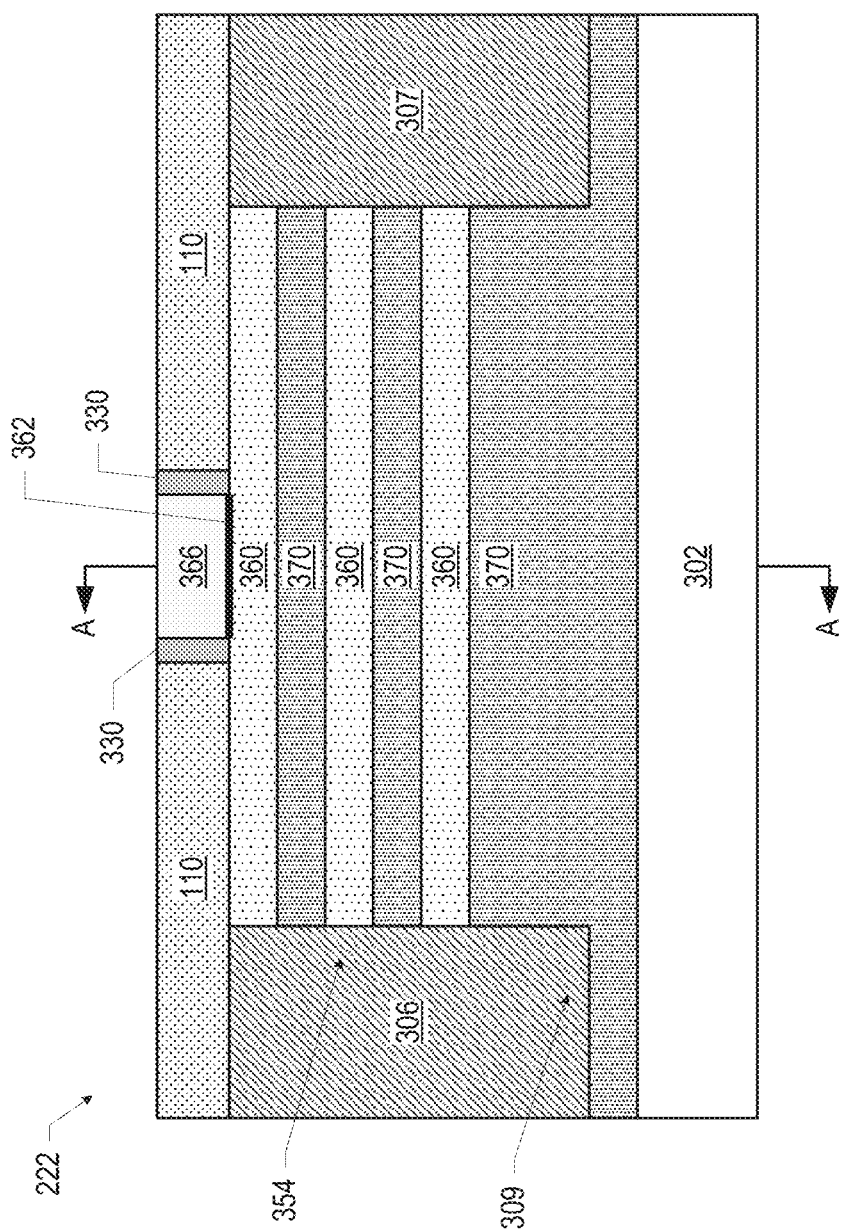

FIG. 11A is a side cross-sectional view of an assembly 220 along the fin 354, FIG. 11B is a cross-sectional view taken through the section A-A of FIG. 11A, FIG. 11C is a side view taken toward the carrier reservoir 306, and FIG. 11D is a top view. The assembly 220 is an embodiment of the assembly 204 of FIG. 3; in the assembly 220, the structures 108 are provided by gate material 366, a hardmask 337, and spacers 330 disposed at opposite faces of the gate material 366/hardmask 337. The base 102 is provided by a fin 354 on and around which the gate material 366 and the spacers 330 are disposed. The protective layer 105 covers the structure 108, and an initial dielectric material 111 is disposed on the protective layer 105; the protective layer 105 and the initial dielectric material 111 may take the form of any of the embodiments disclosed herein.

The assembly 220 may include a substrate 302 on which carrier reservoirs 306 and 307 are disposed. The substrate 302, and the carrier reservoirs 306 and 307, of the assembly 220 may take any of the forms discussed above with reference to the assembly 216 (FIG. 9). The carrier reservoirs 306 may provide the source and drain for an all-around gate transistor formed from the assembly 220, as discussed below.

In the assembly 220, the gate dielectric 362 may be disposed between the gate material 366 and the fin 354, and these materials are sacrificial materials (i.e., materials that will be removed and replaced with alternate materials to form the gate electrode and gate dielectric, respectively, in the IC device).

A hardmask 337 may be disposed on the gate material 366, and spacers 330 may be disposed on opposite faces of the gate material 366/hardmask 337. The hardmask 337 and the spacers 330 of the assembly 220 may take any of the forms discussed above with reference to the assembly 216 (FIG. 9).

STI regions 303 may be disposed on the substrate 302, and an STI layer 305 may be disposed in the STI regions 303. The STI layer 305 of the assembly 220 may take any of the forms discussed above with reference to the assembly 216 (FIG. 9).

The fin 354 may include alternating layers of a semiconductor material 360 and a sacrificial material 370. In later processing of the assembly 220 to form an all-around gate transistor, portions of the layers of sacrificial material 370 may be removed and the layers of semiconductor material 360 may become nanowires that extend between the carrier reservoirs 306 and 307 and provide the channel of the all-around gate transistor. As noted above, the gate material 366 and the gate dielectric 362 may be removed prior to removal of the portions of the layers of sacrificial material, and then new gate dielectric and gate material may be deposited so as to surround the nanowires, providing the all-around gates.

The layers of sacrificial material 370 may induce lattice stress on the layers of semiconductor material 360 by being lattice-mismatched to the layers of semiconductor material 360. The layers of semiconductor material 360 and the layers of sacrificial material 370 may be formed from any well-known materials having different lattice constants. In some embodiments, the layers of semiconductor material 360 and the layers of sacrificial material 370 are each formed from a single crystalline semiconductor material such as, but not limited to, Si, Ge, SiGe, GaAs, InSb, GaP, GaSb, InAlAs, InGaAs, GaSbP, GaAsSb, or InP. In some embodiments, the layers of semiconductor material 360 have a lattice constant different from the lattice constants of the layers of sacrificial material 370 and the top surface of the substrate 302. The fin 354 may be lattice-stressed as a result of the lattice mismatch between the substrate 302, the layers of semiconductor material 360, and the layers of sacrificial material 370.

The fin 354 may be formed by first blanket depositing alternating layers of semiconductor material 360 and sacrificial material 370 on the top surface of the substrate 302 using conventional epitaxial chemical vapor deposition (CVD) methods. Next, the blanket layers of semiconductor material 360 and sacrificial material 370 may be patterned using conventional photolithography and etching methods to define the fin 354. In some embodiments, the substrate 302 may also be etched so that a bottom portion of the fin 354 includes a portion of the substrate 302 (e.g., a portion of the buffer layers 309). In this way, the portion of the substrate 302 that is included in the fin 354 may act as the bottom sacrificial material 370 of the fin 354.

The assembly 220 may be formed by forming the fin 354 on the substrate 302 (e.g., as discussed above), providing the STI layer 305 (e.g., by blanket deposition, planarization, then recess), providing the gate dielectric 362 and the gate material 366, providing and patterning the hardmask 337, patterning the gate dielectric 362 and the gate material 366 in accordance with the template provided by the patterned hardmask 337, forming the spacers 330 on the side faces of the patterned gate electrode material 366 and hardmask 337, and then forming the carrier reservoirs 306 and 307.

FIG. 12 illustrates an assembly 222 subsequent to processing the protective layer 105 and the initial dielectric material 111 to form a dielectric layer 110 over the spacers 330/hardmask 337/gate material 366 of the assembly 220 (FIG. 11), in accordance with any of the techniques discussed herein (e.g., with reference to FIGS. 3 and 4), and then polishing back the excess dielectric layer 110 and hardmask 337. The assembly 222 of FIG. 12 is thus an embodiment of the assembly 206 of FIG. 4. In FIG. 12, the "A" sub-figure represents a cross-sectional view analogous to that of FIG. 11A, the "B" sub-figure represents a cross-sectional view analogous to that of FIG. 11B, the "C" sub-figure represents a cross-sectional view analogous to that of FIG. 11C, and the "D" sub-figure represents a top view analogous to that of FIG. 11D. The polishing of the excess dielectric layer 110 and removal of the hardmask 337 of the assembly 220 may be achieved by using CMP or any other suitable technique (e.g., as discussed above with reference to FIG. 7).

As noted above, the assembly 222 may be further processed to form an all-around gate transistor by, for example, removing the sacrificial gate material 366/gate dielectric 362, removing the exposed sacrificial material 370, providing gate dielectric and gate material on the exposed semiconductor material 360, and forming interconnects to the gate, source, and drain, among other steps.

Figure 13:
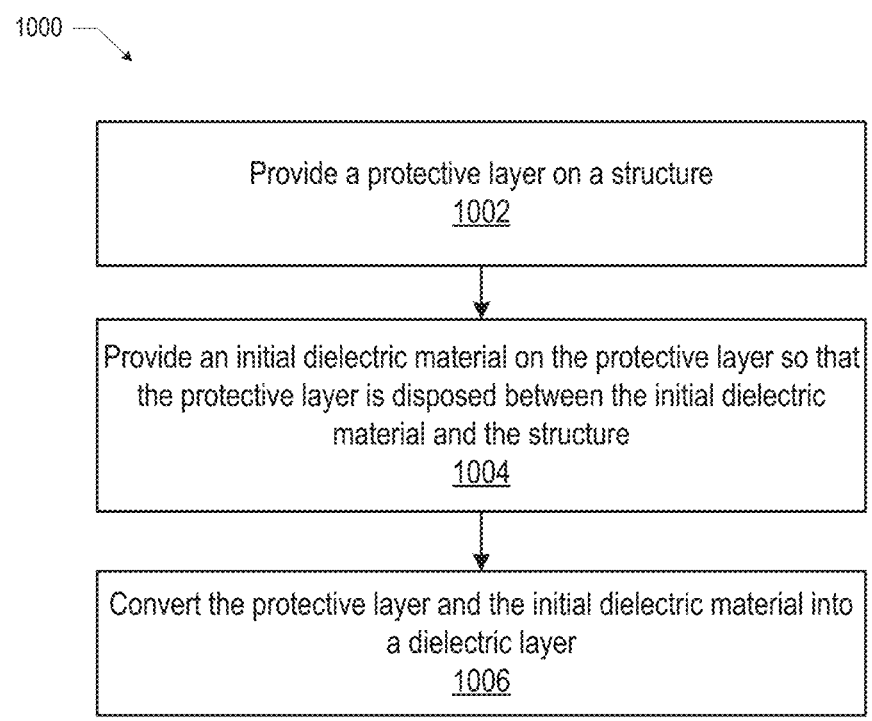
FIG. 13 is a flow diagram of a process for providing a dielectric layer, in accordance with various embodiments.

FIG. 13 is a flow diagram illustrating a method 1000 for forming a dielectric layer 110, in accordance various embodiments. Although the various operations discussed with reference to the method 1000 are shown in a particular order and once each, the operations may be performed in any suitable order (e.g., in any combination of parallel or series performance), and may be repeated or omitted as suitable. Additionally, although various operations of the method 1000 may be illustrated with reference to particular materials disclosed herein, these are simply examples, and the method 1000 may be used with any suitable materials.

At 1002, a protective layer may be provided on an assembly. In some embodiments, the protective layer may be a conformal layer. In some embodiments, the protective layer may fill high aspect ratio recesses in the assembly. For example, the protective layer of 1002 may take any of the forms discussed herein with reference to the protective layer 105.

At 1004, an initial dielectric material may be provided on the protective layer so that the protective layer is disposed between the initial dielectric material and the assembly. In some embodiments, the initial dielectric material may be provided by FCVD. For example, the initial dielectric material of 1004 may take any of the forms discussed herein with reference to the initial dielectric material 111.

At 1006, the protective layer and initial dielectric material may be treated to convert the protective layer and initial dielectric material into a dielectric layer. In some embodiments, the dielectric layer may have a substantially homogenous material composition. For example, any of the curing and/or post-treatments disclosed herein may be performed, as suitable, to form any of the dielectric layers 110 disclosed herein.

Dielectric layers 110 formed using the protective layer techniques disclosed herein may be included in any suitable electronic device. FIGS. 14-17 illustrate various examples of apparatuses that may include dielectric layers formed using any of the protective layer techniques disclosed herein.

FIGS. 14A-14B are top views of a wafer 5200 and dies 5202 that may include dielectric layers formed using any of the protective layer techniques disclosed herein. The wafer 5200 may be composed of semiconductor material and may include one or more dies 5202 having IC elements formed on a surface of the wafer 5200. Each of the dies 5202 may be a repeating unit of a semiconductor product that includes any suitable IC. After the fabrication of the semiconductor product is complete, the wafer 5200 may undergo a singulation process in which each of the dies 5202 is separated from one another to provide discrete "chips" of the semiconductor product. The die 5202 may include one or more transistors (e.g., some of the transistors 5340 of FIG. 15, discussed below), supporting circuitry to route electrical signals to the transistors, insulating material (e.g., dielectric layers formed using any of the protective layer techniques), as well as any other IC components. In some embodiments, the wafer 5200 or the die 5202 may include a memory device (e.g., a static random access memory (SRAM) device), a logic device (e.g., AND, OR, NAND, or NOR gate), or any other suitable circuit element. Multiple ones of these devices may be combined on a single die 5202. For example, a memory array formed by multiple memory devices may be formed on a same die 5202 as a processing device (e.g., the processing device 5502 of FIG. 17) or other logic that is configured to store information in the memory devices or execute instructions stored in the memory array. In some embodiments, the die 5202 may include fins isolated from each other by a dielectric layer formed using any of the protective layer techniques, or transistor gates isolated by a dielectric layer formed using any of the protective layer techniques.

FIG. 15 is a cross-sectional side view of an IC device 5300 that may include dielectric layers formed using any of the protective layer techniques disclosed herein. For example, any of the insulating material included in the IC device 5300 may be formed using the protective layer techniques disclosed herein.

The IC device 5300 may be formed on a substrate 5302 (e.g., the wafer 5200 of FIG. 14A) and may be included in a die (e.g., the die 5202 of FIG. 14B). The substrate 5302 may be a semiconductor substrate composed of semiconductor material systems including, for example, N-type or P-type material systems. The substrate 5302 may include, for example, a crystalline substrate formed using a bulk silicon or a silicon-on-insulator substructure. In some embodiments, the substrate 5302 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 5302. Although a few examples of materials from which the substrate 5302 may be formed are described here, any material that may serve as a foundation for an IC device 5300 may be used. The substrate 5302 may be part of a singulated die (e.g., the dies 5202 of FIG. 14B) or a wafer (e.g., the wafer 5200 of FIG. 14A).

The IC device 5300 may include one or more device layers 5304 disposed on the substrate 5302. The device layer 5304 may include features of one or more transistors 5340 (e.g., metal oxide semiconductor field-effect transistors (MOSFETs)) formed on the substrate 5302. The device layer 5304 may include, for example, one or more source and/or drain (S/D) regions 5320, a gate 5322 to control current flow in the transistors 5340 between the S/D regions 5320, and one or more S/D contacts 5324 to route electrical signals to/from the S/D regions 5320. The transistors 5340 may include additional features not depicted for the sake of clarity, such as device isolation regions, gate contacts, and the like. The transistors 5340 are not limited to the type and configuration depicted in FIG. 15 and may include a wide variety of other types and configurations such as, for example, planar transistors, nonplanar transistors, or a combination of both. Nonplanar transistors may include FinFET transistors, such as double-gate transistors or tri-gate transistors, and wraparound or all-around gate transistors, such as nanoribbon and nanowire transistors. For example, the transistors 5340 may include tri-gate transistors formed as discussed above with reference to FIGS. 9-10, or all-around gate transistors formed as discussed above with reference to FIGS. 11-12.

Each transistor 5340 may include a gate 5322 formed of at least two layers, a gate dielectric layer and a gate electrode layer. The gate dielectric layer may include one layer or a stack of layers. The one or more layers may include silicon oxide, silicon dioxide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer may be formed on the gate dielectric layer and may include at least one P-type work-function metal or N-type work-function metal, depending on whether the transistor 5340 is to be a PMOS or an NMOS transistor. In some implementations, the gate electrode layer may consist of a stack of two or more metal layers, where one or more metal layers are work-function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, and conductive metal oxides (e.g., ruthenium oxide). For an NMOS transistor, metals that may be used for the gate electrode include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide).

In some embodiments, when viewed as a cross section of the transistor 5340 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack. In some embodiments, as discussed above with reference to FIGS. 9-12, the dielectric material abutting the sidewall spacers may be formed using any of the protective layer techniques disclosed herein.

The S/D regions 5320 may be formed within the substrate 5302 adjacent to the gate 5322 of each transistor 5340. The S/D regions 5320 may be formed using either an implantation/diffusion process or an etching/deposition process, for example. In the former process, dopants such as boron, aluminum, antimony, phosphorous, or arsenic may be ion-implanted into the substrate 5302 to form the S/D regions 5320. An annealing process that activates the dopants and causes them to diffuse farther into the substrate 5302 may follow the ion-implantation process. In the latter process, the substrate 5302 may first be etched to form recesses at the locations of the S/D regions 5320. An epitaxial deposition process may then be carried out to fill the recesses with material that is used to fabricate the S/D regions 5320. In some implementations, the S/D regions 5320 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 5320 may be formed using one or more alternate semiconductor materials such as germanium or a group III-V material or alloy. In further embodiments, one or more layers of metal and/or metal alloys may be used to form the S/D regions 5320. Particular examples of source/drain formation techniques are also discussed above with reference to FIGS. 9-10.

Although the transistors 5340 are illustrated in FIG. 15 as located in a single device layer 5304, in some embodiments, transistors 5340 may be located in additional layers in the interlayer dielectric (ILD) stack 5319 of the IC device 5300. In particular, one or more interconnect layers may be disposed between the device layer 5304 and one or more additional layers (not shown) including one or more transistors of any of the types disclosed herein.

Electrical signals, such as power and/or input/output (I/O) signals, may be routed to and/or from the transistors 5340 of the device layer 5304 through one or more interconnect layers disposed on the device layer 5304 (illustrated in FIG. 15 as interconnect layers 5306-5310). For example, electrically conductive features of the device layer 5304 (e.g., the gate 5322 and the S/D contacts 5324) may be electrically coupled with the interconnect structures 5328 of the interconnect layers 5306-5310. The one or more interconnect layers 5306-5310 may form the ILD stack 5319 of the IC device 5300.

The interconnect structures 5328 may be arranged within the interconnect layers 5306-5310 to route electrical signals according to a wide variety of designs (in particular, the arrangement is not limited to the particular configuration of interconnect structures 5328 depicted in FIG. 15). Although a particular number of interconnect layers 5306-5310 is depicted in FIG. 15, embodiments of the present disclosure include IC devices having more or fewer interconnect layers than depicted.

In some embodiments, the interconnect structures 5328 may include conductive lines 5328a and/or conductive vias 5328b filled with an electrically conductive material such as a metal. The conductive lines 5328a may be arranged to route electrical signals in a direction of a plane that is substantially parallel with a surface of the substrate 5302 upon which the device layer 5304 is formed. For example, the conductive lines 5328a may route electrical signals in a direction in and out of the page from the perspective of FIG.

15. The conductive vias 5328*b* may be arranged to route electrical signals in a direction of a plane that is substantially perpendicular to the surface of the substrate 5302 upon which the device layer 5304 is formed.

The interconnect layers 5306-5310 may include a dielectric material 5326 disposed between the interconnect structures 5328, as shown in FIG. 15. In some embodiments, the dielectric material 5326 disposed between the interconnect structures 5328 in different ones of the interconnect layers 5306-5310 may have different compositions; in other embodiments, the composition of the dielectric material 5326 between different interconnect layers 5306-5310 may be the same. In some embodiments, some or all of the dielectric material 5326 may take the form of the dielectric layer 110, and may be formed using any of the protective layer techniques disclosed herein.

A first interconnect layer 5306 (referred to as Metal 1 or "M1") may be formed directly on the device layer 5304. In some embodiments, the first interconnect layer 5306 may include conductive lines 5328*a* and/or conductive vias 5328*b*, as shown. The conductive lines 5328*a* of the first interconnect layer 5306 may be coupled with contacts (e.g., the S/D contacts 5324) of the device layer 5304.

A second interconnect layer 5308 (referred to as Metal 2 or "M2") may be formed directly on the first interconnect layer 5306. In some embodiments, the second interconnect layer 5308 may include conductive vias 5328*b* to couple the conductive lines 5328*a* of the second interconnect layer 5308 with the conductive lines 5328*a* of the first interconnect layer 5306. Although the conductive lines 5328*a* and the conductive vias 5328*b* are structurally delineated with a line within each interconnect layer (e.g., within the second interconnect layer 5308) for the sake of clarity, the conductive lines 5328*a* and the conductive vias 5328*b* may be structurally and/or materially contiguous (e.g., simultaneously filled during a dual-damascene process) in some embodiments.

A third interconnect layer 5310 (referred to as Metal 3 or "M3") (and additional interconnect layers, as desired) may be formed in succession on the second interconnect layer 5308 according to similar techniques and configurations described in connection with the second interconnect layer 5308 or the first interconnect layer 5306.

The IC device 5300 may include a solder resist material 5334 (e.g., polyimide or similar material) and one or more bond pads 5336 formed on the interconnect layers 5306-5310. The bond pads 5336 may be electrically coupled with the interconnect structures 5328 and configured to route the electrical signals of the transistor(s) 5340 to other external devices. For example, solder bonds may be formed on the one or more bond pads 5336 to mechanically and/or electrically couple a chip including the IC device 5300 with another component (e.g., a circuit board). The IC device 5300 may have other alternative configurations to route the electrical signals from the interconnect layers 5306-5310 than depicted in other embodiments. For example, the bond pads 5336 may be replaced by or may further include other analogous features (e.g., posts) that route the electrical signals to external components.

Figure 16:
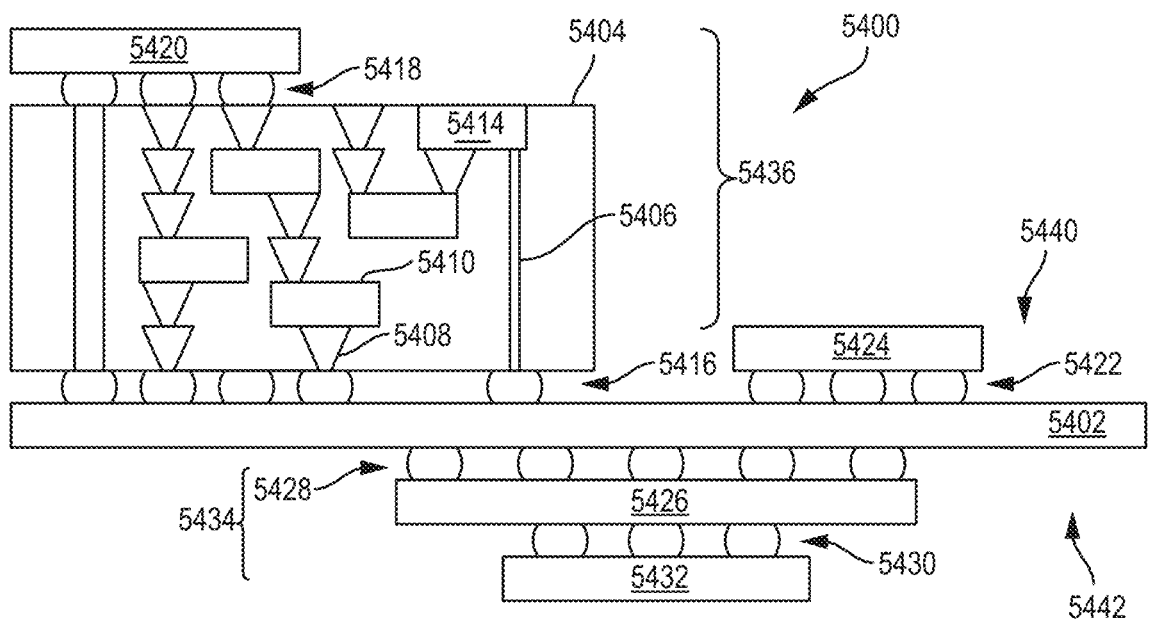
FIG. 16 is a cross-sectional side view of an IC device assembly that may include dielectric layers formed using any of the protective layer techniques disclosed herein.

FIG. 16 is a cross-sectional side view of an IC device assembly 5400 that may include dielectric layers formed using any of the protective layer techniques disclosed herein. The IC device assembly 5400 includes a number of components disposed on a circuit board 5402. The IC device assembly 5400 may include components disposed on a first face 5440 of the circuit board 5402 and an opposing second face 5442 of the circuit board 5402; generally, components may be disposed on one or both faces 5440 and 5442.

In some embodiments, the circuit board 5402 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 5402. In other embodiments, the circuit board 5402 may be a non-PCB substrate.

The IC device assembly 5400 illustrated in FIG. 16 includes a package-on-interposer structure 5436 coupled to the first face 5440 of the circuit board 5402 by coupling components 5416. The coupling components 5416 may electrically and mechanically couple the package-on-interposer structure 5436 to the circuit board 5402, and may include solder balls (as shown in FIG. 16), male and female portions of a socket, an adhesive, an underfill material, and/or any other suitable electrical and/or mechanical coupling structure.

The package-on-interposer structure 5436 may include an IC package 5420 coupled to an interposer 5404 by coupling components 5418. The coupling components 5418 may take any suitable form for the application, such as the forms discussed above with reference to the coupling components 5416. Although a single IC package 5420 is shown in FIG. 16, multiple IC packages may be coupled to the interposer 5404; indeed, additional interposers may be coupled to the interposer 5404. The interposer 5404 may provide an intervening substrate used to bridge the circuit board 5402 and the IC package 5420. The IC package 5420 may be or include, for example, a die (the die 5202 of FIG. 14B), an IC device (e.g., the IC device 5300 of FIG. 15 or any of the devices disclosed herein), or any other suitable component. Generally, the interposer 5404 may spread a connection to a wider pitch or reroute a connection to a different connection. For example, the interposer 5404 may couple the IC package 5420 (e.g., a die) to a ball grid array (BGA) of the coupling components 5416 for coupling to the circuit board 5402. In the embodiment illustrated in FIG. 16, the IC package 5420 and the circuit board 5402 are attached to opposing sides of the interposer 5404; in other embodiments, the IC package 5420 and the circuit board 5402 may be attached to a same side of the interposer 5404. In some embodiments, three or more components may be interconnected by way of the interposer 5404.

The interposer 5404 may be formed of an epoxy resin, a fiberglass-reinforced epoxy resin, a ceramic material, or a polymer material such as polyimide. In some embodiments, the interposer 5404 may be formed of alternate rigid or flexible materials that may include the same materials described above for use in a semiconductor substrate, such as silicon, germanium, and other group III-V and group IV materials. The interposer 5404 may include metal interconnects 5408 and vias 5410, including but not limited to through-silicon vias (TSVs) 5406. The interposer 5404 may further include embedded devices 5414, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 5404. The package-on-interposer structure 5436 may take the form of any of the package-on-interposer structures known in the art.

The IC device assembly 5400 may include an IC package 5424 coupled to the first face 5440 of the circuit board 5402 by coupling components 5422. The coupling components 5422 may take the form of any of the embodiments discussed above with reference to the coupling components 5416, and the IC package 5424 may take the form of any of the embodiments discussed above with reference to the IC package 5420.

The IC device assembly 5400 illustrated in FIG. 16 includes a package-on-package structure 5434 coupled to the second face 5442 of the circuit board 5402 by coupling components 5428. The package-on-package structure 5434 may include an IC package 5426 and an IC package 5432 coupled together by coupling components 5430 such that the IC package 5426 is disposed between the circuit board 5402 and the IC package 5432. The coupling components 5428 and 5430 may take the form of any of the embodiments of the coupling components 5416 discussed above, and the IC packages 5426 and 5432 may take the form of any of the embodiments of the IC package 5420 discussed above.

Figure 17:
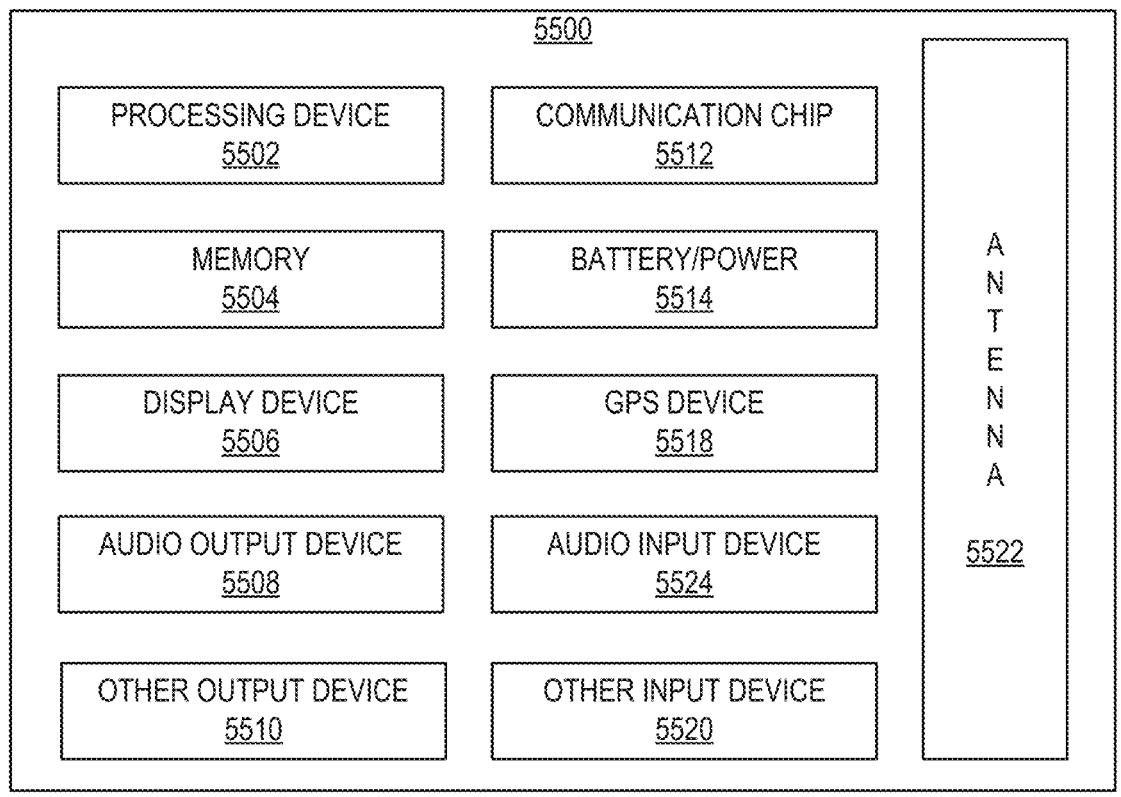
FIG. 17 is a block diagram of an example computing device that may include dielectric layers formed using any of the protective layer techniques disclosed herein.

FIG. 17 is a block diagram of an example computing device 5500 that may include dielectric layers formed using any of the protective layer techniques disclosed herein. For example, any suitable ones of the components of the computing device 5500 may include, or be included in, a die including dielectric layers formed using any of the protective layer techniques disclosed herein. A number of components are illustrated in FIG. 17 as included in the computing device 5500, but any one or more of these components may be omitted or duplicated, as suitable for the application. In some embodiments, some or all of the components included in the computing device 5500 may be attached to one or more motherboards. In some embodiments, some or all of these components are fabricated onto a single system-on-a-chip (SoC) die.

Additionally, in various embodiments, the computing device 5500 may not include one or more of the components illustrated in FIG. 17, but the computing device 5500 may include interface circuitry for coupling to the one or more components. For example, the computing device 5500 may not include a display device 5506, but may include display device interface circuitry (e.g., a connector and driver circuitry) to which a display device 5506 may be coupled. In another set of examples, the computing device 5500 may not include an audio input device 5524 or an audio output device 5508, but may include audio input or output device interface circuitry (e.g., connectors and supporting circuitry) to which an audio input device 5524 or audio output device 5508 may be coupled.

The computing device 5500 may include a processing device 5502 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 5502 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 5500 may include a memory 5504, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 5504 may include memory that shares a die with the processing device 5502. This memory may be used as cache memory and may include embedded dynamic random access memory (eDRAM) or spin transfer torque magnetic random-access memory (STT-MRAM). In some embodiments, the processing device 5502 and/or the memory 5504 may include dielectric layers formed using any of the protective layer techniques disclosed herein.

In some embodiments, the computing device 5500 may include a communication chip 5512 (e.g., one or more communication chips). For example, the communication chip 5512 may be configured for managing wireless communications for the transfer of data to and from the computing device 5500. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not. In some embodiments, the communication chip 5512 may include dielectric layers formed using any of the protective layer techniques disclosed herein.

The communication chip 5512 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 5512 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 5512 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 5512 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 5512 may operate in accordance with other wireless protocols in other embodiments. The computing device 5500 may include an antenna 5522 to facilitate wireless communications and/or to receive other wireless communications (such as AM or FM radio transmissions).

In some embodiments, the communication chip 5512 may manage wired communications, such as electrical, optical, or any other suitable communication protocols (e.g., the Ethernet). As noted above, the communication chip 5512 may include multiple communication chips. For instance, a first communication chip 5512 may be dedicated to shorter-range wireless communications such as Wi-Fi or Bluetooth, and a second communication chip 5512 may be dedicated to longer-range wireless communications such as GPS, EDGE, GPRS, CDMA, WiMAX, LTE, EV-DO, or others. In some embodiments, a first communication chip 5512 may be dedicated to wireless communications, and a second communication chip 5512 may be dedicated to wired communications.

The computing device 5500 may include battery/power circuitry 5514. The battery/power circuitry 5514 may include one or more energy storage devices (e.g., batteries or capacitors) and/or circuitry for coupling components of the computing device 5500 to an energy source separate from the computing device 5500 (e.g., AC line power).

The computing device 5500 may include a display device 5506 (or corresponding interface circuitry, as discussed above). The display device 5506 may include any visual indicators, such as a heads-up display, a computer monitor, a projector, a touchscreen display, a liquid crystal display (LCD), a light-emitting diode display, or a flat panel display, for example.

The computing device 5500 may include an audio output device 5508 (or corresponding interface circuitry, as discussed above). The audio output device 5508 may include any device that generates an audible indicator, such as speakers, headsets, or earbuds, for example.

The computing device 5500 may include an audio input device 5524 (or corresponding interface circuitry, as discussed above). The audio input device 5524 may include any device that generates a signal representative of a sound, such as microphones, microphone arrays, or digital instruments (e.g., instruments having a musical instrument digital interface (MIDI) output).

The computing device 5500 may include a global positioning system (GPS) device 5518 (or corresponding interface circuitry, as discussed above). The GPS device 5518 may be in communication with a satellite-based system and may receive a location of the computing device 5500, as known in the art.

The computing device 5500 may include another output device 5510 (or corresponding interface circuitry, as discussed above). Examples of the other output device 5510 may include an audio codec, a video codec, a printer, a wired or wireless transmitter for providing information to other devices, or an additional storage device.

The computing device 5500 may include another input device 5520 (or corresponding interface circuitry, as discussed above). Examples of the other input device 5520 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 5500 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 5500 may be any other electronic device that processes data.

The following paragraphs provide various examples of the embodiments disclosed herein.

Example 1 is an integrated circuit (IC) device, including: a first structure on a base, wherein the first structure has a width that is 4 nanometers or less; a second structure on the base, wherein the second structure has a width that is 4 nanometers or less; a trench bounded by the first structure, the second structure, and the base, wherein the trench has a height-to-width aspect ratio greater than or equal to 4:1; and a dielectric layer that fills at least a bottom portion of the trench.

Example 2 may include the subject matter of Example 1, and may further specify that the first structure is a first fin and the second structure is a second fin.

Example 3 may include the subject matter of Example 2, and may further specify that the first fin is a semiconductor fin, the second fin is a semiconductor fin, and the first fin, the second fin, and the base have the same semiconductor composition.

Example 4 may include the subject matter of Example 2, and may further specify that the first fin includes multiple different material layers, and the second fin includes multiple different material layers.

Example 5 may include the subject matter of any of Examples 2-4, and may further include: a first gate on the first fin; and a second gate on the second fin.

Example 6 may include the subject matter of any of Examples 1-5, and may further specify that the trench has a width of 30 nanometers or less.

Example 7 may include the subject matter of any of Examples 1-6, and may further specify that the dielectric layer includes an oxide, a nitride, or a carbide.

Example 8 may include the subject matter of any of Examples 1-7, and may further specify that the dielectric layer has a homogenous composition.

Example 9 may include the subject matter of any of Examples 1-8, and may further specify that the dielectric layer includes a first dielectric portion that is conformal over the first structure and the second structure, and a second dielectric portion on the first dielectric portion.

Example 10 may include the subject matter of Example 9, and may further specify that the first dielectric portion and the second dielectric portion have different material compositions.

Example 11 is a method of manufacturing an integrated circuit (IC) device, including: providing a first dielectric material on a structure; providing a second dielectric material on the first dielectric material, wherein the first dielectric material and the second dielectric material have different material compositions; and annealing the first dielectric material and the second dielectric material.

Example 12 may include the subject matter of Example 11, and may further specify that providing the first dielectric material includes conformally depositing the first dielectric material.

Example 13 may include the subject matter of Example 12, and may further specify that conformally depositing the first dielectric material includes depositing the first dielectric material via atomic layer deposition (ALD).

Example 14 may include the subject matter of any of Examples 11-13, wherein providing the second dielectric material includes providing a flowable dielectric material.

Example 15 may include the subject matter of Example 14, and may further specify that providing the flowable dielectric material includes using a flowable chemical vapor deposition (FCVD) process.

Example 16 may include the subject matter of any of Examples 14-15, and may further specify that providing the second dielectric material includes curing the flowable dielectric material.

Example 17 may include the subject matter of any of Examples 11-16, and may further specify that annealing the first dielectric material and the second dielectric material results in converting the first dielectric material and the second dielectric material into a substantially materially homogenous dielectric layer.

Example 18 may include the subject matter of any of Examples 11-17, and may further specify that the first dielectric material includes an oxide, a carbide, or a nitride.

Example 19 may include the subject matter of any of Examples 11-18, and may further specify that annealing the first dielectric material and the second dielectric material includes performing a plasma anneal.

Example 20 may include the subject matter of any of Examples 11-19, and may further specify that the structure includes sidewall spacers.

Example 21 may include the subject matter of any of Examples 11-20, and may further specify that the structure includes a fin.

Example 22 is a computing device, including: a processing device including a first transistor and a second transistor, wherein the first transistor includes at least a portion of a first fin, the first fin has a width that is 4 nanometers or less, the second transistor includes at least a portion of a second fin, the second fin has a width that is 4 nanometers or less, the first transistor and the second transistor define a trench therebetween, the trench has a height-to-width aspect ratio greater than or equal to 4:1, and a dielectric layer fills at least a bottom portion of the trench; and a memory device, communicatively coupled to the processing device.

Example 23 may include the subject matter of Example 22, and may further specify that the first fin and the second fin extend from a semiconductor substrate.

Example 24 may include the subject matter of Example 22, and may further specify that the first fin and the second fin are spaced apart from a semiconductor substrate by one or more intervening interconnect layers.

Example 25 may include the subject matter of any of Examples 22-24, and may further specify that the computing device further includes a communication chip.

The invention claimed is:

1. A method of manufacturing an integrated circuit (IC) device, comprising:
    providing a first dielectric material on a structure;
    providing a second dielectric material on the first dielectric material, wherein the first dielectric material and the second dielectric material have different material compositions; and
    annealing the first dielectric material and the second dielectric material, where oxidants in the second dielectric material diffuse into the first dielectric material during the annealing.

2. The method of claim 1, wherein providing the first dielectric material includes conformally depositing the first dielectric material.

3. The method of claim 2, wherein conformally depositing the first dielectric material includes depositing the first dielectric material via atomic layer deposition (ALD).

4. The method of claim 1, wherein providing the second dielectric material includes providing a flowable dielectric material.

5. The method of claim 4, wherein providing the flowable dielectric material includes using a flowable chemical vapor deposition (FCVD) process.

6. The method of claim 4, wherein providing the second dielectric material includes curing the flowable dielectric material.

7. The method of claim 1, wherein annealing the first dielectric material and the second dielectric material results in converting the first dielectric material and the second dielectric material into a substantially materially homogenous dielectric layer.

8. The method of claim 1, wherein the first dielectric material includes an oxide.

9. The method of claim 1, wherein the first dielectric material includes a carbide.

10. The method of claim 1, wherein the first dielectric material includes a nitride.

11. The method of claim 1, wherein annealing the first dielectric material and the second dielectric material includes performing a plasma anneal.

12. The method of claim 1, wherein the structure includes sidewall spacers.

13. The method of claim 1, wherein the structure includes a fin.

* * * * *